US012712544B2

(12) United States Patent
Yadav et al.

(10) Patent No.: US 12,712,544 B2
(45) Date of Patent: Aug. 18, 2026

(54) IMPEDANCE CALIBRATION FOR SERDES TRANSMITTER DRIVER

(71) Applicant: QUALCOMM Incorporated, San Diego, CA (US)

(72) Inventors: Kshitij Yadav, San Diego, CA (US); Nitz Saputra, San Diego, CA (US); Sameer Wadhwa, San Diego, CA (US)

(73) Assignee: QUALCOMM Incorproated, San Diego, CA (US)

( * ) Notice: Subject to any disclaimer, the term of this patent is extended or adjusted under 35 U.S.C. 154(b) by 37 days.

(21) Appl. No.: 18/956,553

(22) Filed: Nov. 22, 2024

(65) Prior Publication Data

US 2026/0149449 A1 May 28, 2026

(51) Int. Cl.
*H03K 17/687* (2006.01)
*H03K 5/24* (2006.01)

(52) U.S. Cl.
CPC ........... *H03K 17/6874* (2013.01); *H03K 5/24* (2013.01)

(58) Field of Classification Search
None
See application file for complete search history.

(56) References Cited

U.S. PATENT DOCUMENTS 7,821,290 B2 * 10/2010 Thomsen ........... H03K 17/6874 326/86
8,604,826 B2 12/2013 Cho et al.
10,103,731 B2 * 10/2018 Hardee .............. H03K 19/0005
10,855,254 B2 * 12/2020 Guo ......................... H04B 1/04
11,088,676 B1 * 8/2021 Lee .................... H03K 19/0005
11,770,105 B2 * 9/2023 Takeuchi ............ H03F 3/45748 359/824
12,470,042 B2 * 11/2025 Akbari-Dilmaghani ..................... H01S 5/0617
2007/0194967 A1 8/2007 Huang

FOREIGN PATENT DOCUMENTS

WO 2014022719 A1 2/2014

OTHER PUBLICATIONS

International Search Report and Written Opinion—PCT/US2025/054397—ISA/EPO—Mar. 16, 2026.

Woo Y.H., et al., "Low-dropout regulator with dual cross-coupled current mirrors", International Journal of Circuit Theory and Applications, John Wiley & Sons, Inc, Hoboken, USA, vol. 47, No. 11, Nov. 28, 2019, pp. 1869-1876, XP071448625, figure 1.

* cited by examiner

*Primary Examiner* — Cassandra F Cox
(74) *Attorney, Agent, or Firm* — Loza & Loza, LLP

(57) ABSTRACT

A method for calibrating an output driver includes generating a first current representative of current flowing through a termination impedance of an output driver, generating a second current representative of current flowing through a replica driver stage comprising one or more replicas of a driver stage in a driver segment in the output driver, and comparing the first current and the second current using a current comparator. Generating the second current includes controlling gate voltage of first transistors configured to provide a reference current to the replica driver stage to maintain a predefined voltage across the replica driver stage. The gates of the first transistors are coupled to gates of second transistors that are configured to provide a scaled version of the reference current to third transistors that are included in a current mirror. The second current is received from the current comparator.

20 Claims, 11 Drawing Sheets

SoC

102 Central Processing Unit (CPU)

104 Modem Processor

106 Graphics Processor (GPU)

108 Application Processor

122 Interconnection/Bus Module

112 Serial Bus Controller

114 Memory Controller

116 Centralized Resource Manager (CRM)

110 System Components and Resources

126 Memory Interface/Bus

124 Memory

Rank-0

Rank-1

IMPEDANCE CALIBRATION FOR SERDES TRANSMITTER DRIVER

TECHNICAL FIELD

The present disclosure generally relates to driver circuits and more particularly to impedance calibration in a serializer/deserializer (SERDES) interface.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components. For example, the high-speed bus interface may be implemented using a Peripheral Component Interconnect Express (PCIe) bus, Universal Serial Bus (USB) or Serial Advanced Technology Attachment (SATA), among others.

Integrated circuit (IC) devices may include a serializer/deserializer (SERDES) to transmit and receive through a communication link. In high-speed applications, timing of the operation of a SERDES may be controlled by multiple clock signals. In certain implementations, a high-speed serial bus interface may be configurable for different modes of communication. For example, IC devices that include memory interfaces have physical layer circuits may be expected to operate in one or more high-speed data communication modes and one or more low-speed data communication modes. Different signaling voltages may be defined for high-speed and low-speed data communication modes. Increased demands for higher data rates require increasingly tight timing between circuits within the memory interface in order to ensure integrity of the data and clock signals between memory controller and memory devices.

Therefore, there is an ongoing need for improved performance, accuracy and/or reliability of interfaces may depend on the flexibility and reliability of data communication interface circuits that are expected to accommodate changes in transmission speed, supply voltage variances and other factors that can impact the operation of high-speed data links.

SUMMARY

Certain aspects of the disclosure relate to systems, apparatus, methods and circuits that can be used in high-performance and low-power modes without coexistence issues.

In various aspects of the disclosure, a calibration circuit in an output driver has comprising three sections. A first section includes a first plurality of transistors powered by a first power rail, a first error amplifier and a variable resistor. The first error amplifier has a first input coupled to a first reference voltage source, a second input coupled to a feedback signal provided by an output of the first plurality of transistors and an output coupled to a gate of each transistor in the first plurality of transistors. The variable resistor is coupled to the output of each transistor in the first plurality of transistors. A second section includes a second plurality of transistors powered by the first power rail, a third plurality of transistors powered by the first power rail, a fourth plurality of transistors, a replica driver stage and a second error amplifier. The second plurality of transistors and third plurality of transistors may be powered by the first power rail. The replica driver stage is coupled between the first power rail and ground through the second plurality of transistors. The replica driver stage includes replicas of one or more driver segments in the output driver. The second error amplifier has a first input coupled to a second reference voltage source, a second input coupled to a node through which the output of the second plurality of transistors is coupled to the replica driver stage, and an output coupled to a gate of each transistor in the second plurality of transistors and the third plurality of transistors. The fourth plurality of transistors is included in a current mirror. The fourth plurality of transistors is configured to receive a current from the third plurality of transistors. A third section includes a current comparator, a fifth plurality of transistors and at least one mirror transistor. The fifth plurality of transistors may be powered by the first power rail. Each transistor in the fifth plurality of transistors has a gate that is coupled to the output of the first error amplifier, which is provided in the first section. An output of the fifth plurality of transistors is coupled to a first input of the current comparator. The mirror transistor may be configured to provide an output of the current mirror to a second input of the current comparator.

In various aspects of the disclosure, an apparatus includes means for generating a first current that is representative of current flowing through a termination impedance of an output driver, means for generating a second current and a current comparator. The second current is representative of current flowing through a replica driver that includes one or more replicas of a driver segment in the output driver. The current comparator is configured to compare the first current and the second current. The means for generating the second current includes a first plurality of transistors powered by a first power rail, a second plurality of transistors powered by the first power rail, a replica driver stage, an error amplifier and a third plurality of transistors. The replica driver stage is coupled between the first power rail and ground through the first plurality of transistors and includes one or more replicas of a driver segment in the output driver. The error amplifier has a first input coupled to a reference voltage source, a second input coupled to a node through which the output of the first plurality of transistors is coupled to the replica driver stage, and an output coupled to a gate of each transistor in the first plurality of transistors and a gate of each transistor in the second plurality of transistors. The third plurality of transistors is included in a current mirror and configured to receive a current from the second plurality of transistors. At least one mirror transistor is configured to provide an output of the current mirror to a second input of the current comparator.

In various aspects of the disclosure, a method for calibrating an output driver includes generating a first current that is representative of current flowing through a termination impedance of an output driver, generating a second current that is representative of current flowing through a replica driver stage comprising one or more replicas of a driver stage in a driver segment in the output driver, and comparing the first current and the second current using a current comparator. Generating the second current includes controlling gate voltage of a first plurality of transistors configured to provide a reference current to the replica driver stage to maintain a predefined voltage across the replica driver stage. The gates of the first plurality of transistors are coupled to gates of a second plurality of transistors that is configured to provide a scaled version of the reference current to a third plurality of transistors that is included in a current mirror. The second current is received from the current comparator.

In one aspect, the first reference voltage source in the first section includes a current source that is coupled between the first power rail and ground through a programmable resistor. The first input of the first error amplifier may be coupled to a node through which the current source is coupled to the programmable resistor. The programmable resistor may be configured to provide a voltage at the node that is equal to voltage of a second power rail. The first power rail and the second power rail may deliver power at different voltages. The variable resistor coupled to the output of each transistor in the first plurality of transistors may be configured to provide a resistance that represents or matches a nominal terminal impedance specified for the output driver.

In one aspect, the amplitude of current provided to the first input of the current comparator is a multiple (P/Q) of the amplitude of current flowing in the variable resistor. The multiple of the amplitude may be defined by a ratio of number (P) of transistors in the first plurality of transistors to number (Q) of transistors in the fifth plurality of transistors. The amplitude of the current provided to the second input of the current comparator may be a multiple of the amplitude of current flowing in the replica driver stage.

In one aspect, the second reference voltage source is configured to maintain the first input of the second error amplifier in the second stage at a voltage that is equal to voltage of a second power rail. The second plurality of transistors may include a first number (L) of transistors, the third plurality of transistors may include a second number (S) of transistors, the fourth plurality of transistors may include a third number (M) of transistors and the replica driver stage may include a number (N) replicas of the driver segment. The variable resistor in the first section may be configured to provide a first resistance ($R_{Target}$), each driver segment in the output driver may have a second resistance ($R_{LSB}$) and wherein:

$$S \approx \frac{L \times M}{N} \times \frac{R_{LSB}}{R_{Target}}$$

when an amplitude of the current provided to the first input of the current comparator equals an amplitude of the current provided to the second input of the current comparator.

DETAILED DESCRIPTION

Figure 1:
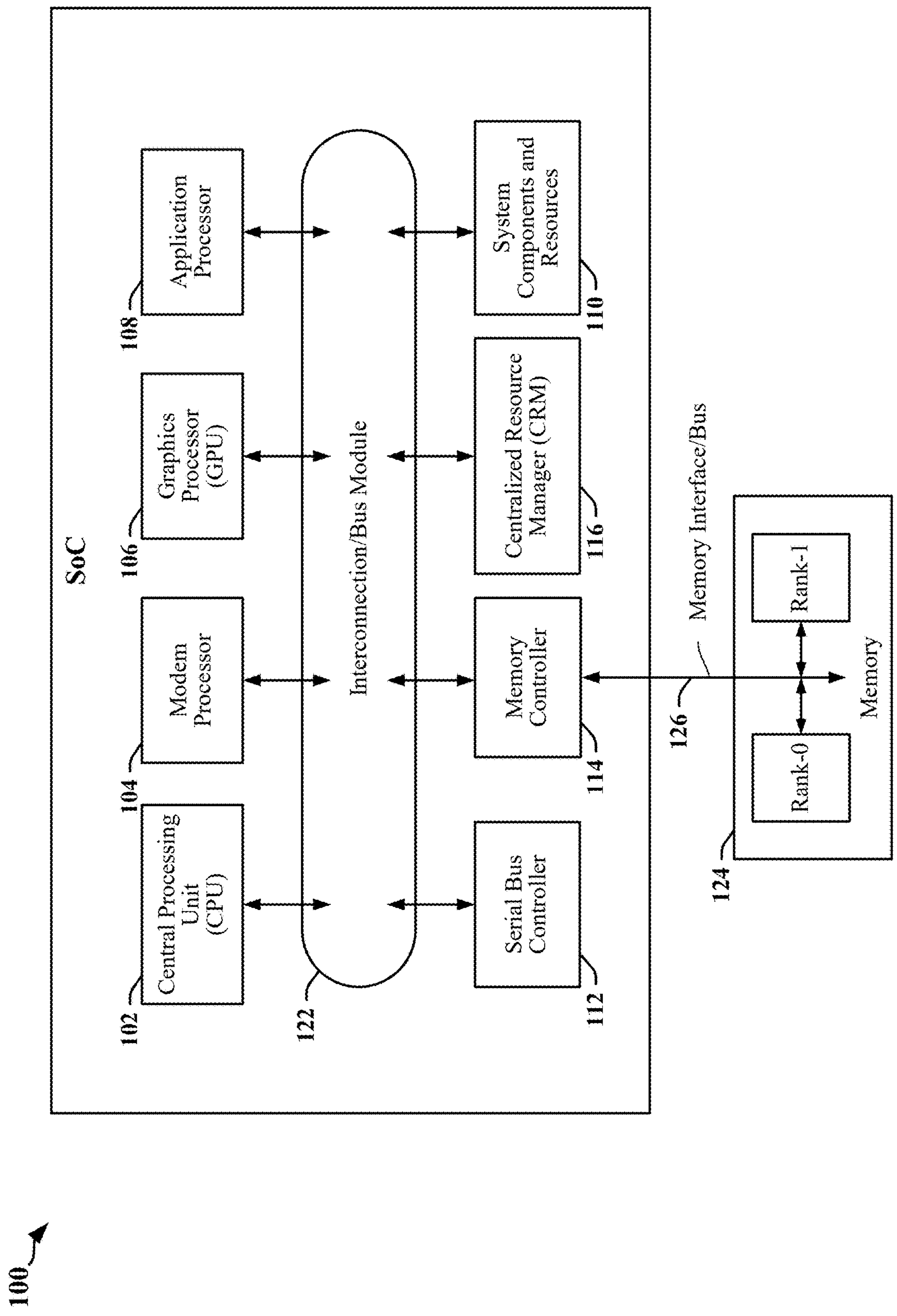
FIG. 1 illustrates an example of a system-on-a-chip (SOC) that may be adapted in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, notebooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

Certain circuits are illustrated in this disclosure as being implemented using combinations of P-type metal-oxide-semiconductor (PMOS) transistors and N-type metal-oxide-semiconductor (NMOS) transistors. These circuits are provided by way of example only, and it is contemplated that the concepts disclosed herein can be implemented in circuits that use different combinations of NMOS and PMOS transistors. Circuits that include NMOS and PMOS transistors are typically coupled to the rails of a power supply. The power supply provides a current that flows from a higher voltage rail to a lower voltage rail. A rail may include some combination of conductors, wires, connectors and other types of interconnect. For the purposes of this description, the higher voltage rail may be referenced as "VDD" or "$V_{DD}$" and the lower voltage rail may be referred to as Ground. In some implementations, power may be provided to certain circuits through more than two rails.

FIG. 1 illustrates examples of components and interconnections that may be incorporated in a system-on-chip (SoC) 100, and which may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include interface circuits that support inter-processor communication and/or communication between one or more of the processors 102, 104, 106, 108, memory, wireless modems, and other peripherals. Many of these interface circuits are based on serializer/deserializer (SERDES) circuits that enable transmission and reception of data over a communication link. SERDES circuits may be used to support high-speed and low-speed communication.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip.

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via a memory interface/bus 126. In some examples, the memory controller 114 includes one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Certain aspects of the disclosure are applicable to data communication interfaces that include SERDES circuits. For example, SERDES-based data communication interfaces may be used in communication links operated in accordance with Peripheral Component Interconnect Express (PCIe) or USB protocols, and in Advanced High-Performance Bus (AHB) protocols defined by Advanced Microcontroller Bus Architecture (AMBA) specifications. SERDES-based data communication interface may be used to provide an interface between core circuits and Synchronous Dynamic Random Access Memory (SDRAM) devices, including Low-Power double data rate SDRAM (LPDDR SDRAM) that can be configured for high-speed and low-power modes of operation.

Figure 2:
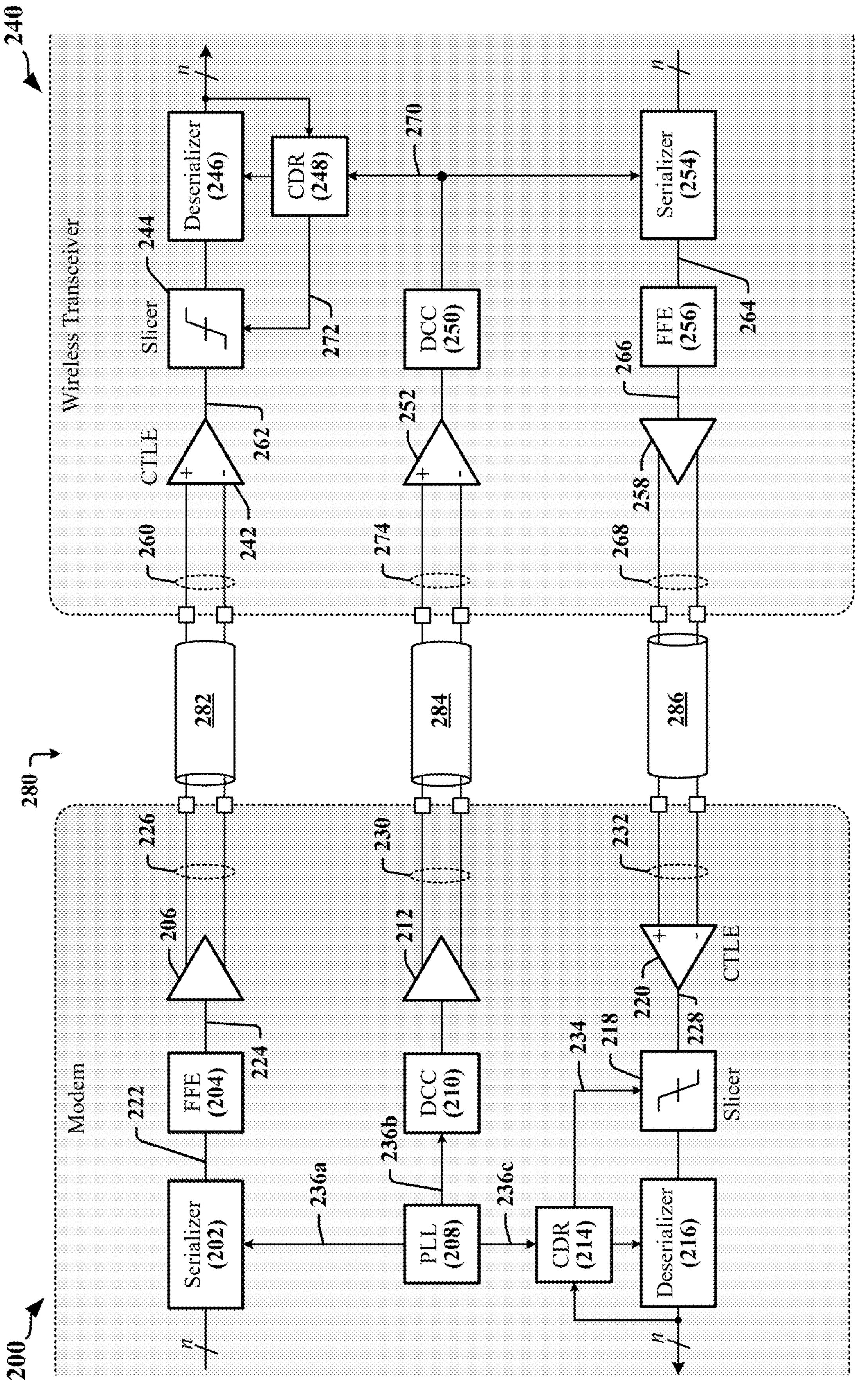
FIG. 2 illustrates an example of a system that employs a multi-channel data communication link.

FIG. 2 illustrates an example of a system that employs a SERDES-based multi-channel data communication link 280 to couple a modem 200 with a wireless transceiver 240. The data communication link 280 includes data channels 282 and 286 and a clock channel 284 that provide a transmission medium through which signals propagate between devices. In the illustrated example, a modem 200 transmits data in a first signal over a first data channel 282 to a wireless transceiver 240 and receives data in a second signal transmitted over a second data channel 286. Data signals are transmitted over the data channels 282 and 286 in accordance with timing information provided by a bus clock signal 230 transmitted over the clock channel 284.

The modem 200 may include a serializer 202 configured to convert n-bit parallel data elements, bytes or words into a serial data stream for transmission in a transmit data signal 222 over the first data channel 282. The transmit data signal 222 may be preconditioned by a pre-equalizing circuit, such as the illustrated digital feed-forward equalizer (the FFE 204), in order to combat or compensate for signal distortions attributable to inter-symbol interference (ISI), reflection and other effects that can be expected to limit bandwidth in first data channel 282. The preconditioned transmit data signal 224 output by the FFE 204 is provided to a driver circuit 206 that is configured drive the first data channel 282.

The modem 200 may include a serializer 202 configured to convert n-bit parallel data elements, bytes or words into a serial data stream for transmission in a serialized data signal 222. The serialized data signal 222 may be preconditioned by a pre-equalizing circuit, such as the illustrated digital feed-forward equalizer (the FFE 204), in order to combat or compensate for signal distortions attributable to inter-symbol interference (ISI), reflection and other effects that can be expected to limit bandwidth in the first data channel 282. A preconditioned data signal 224 output by the FFE 204 is provided to a driver circuit 206 that is configured generate and transmit a differential transmit data signal 226 over the first data channel 282. For the purposes of this disclosure, a differential signal includes two complementary signals that are phase-shifted by 180° with respect to one another.

The wireless transceiver 240 can be configured to process a data signal 260 received over the first data channel 282. The data signal 260 may be provided to a differential receiver 242, which may include or cooperate with an equalizing circuit. In one example, continuous time linear equalization (CTLE) may be used to compensate for certain losses experienced in the first data channel 282. The first data channel 282 may be characterized in some respects as a low-pass filter. In the illustrated example, the differential receiver 242 outputs an equalized data signal 262 that is sampled by a slicer 244. The slicer 244 may be implemented using a D-flipflop or the like and may be configured to capture signaling state of the equalized data signal 262 under the control of edges in a sampling clock signal 272 generated by a clock and data recovery (CDR) circuit 248. The output of the slicer 244 may be provided to a deserializer 246 that is clocked in accordance with one or more clock signals provided by the CDR circuit 248. The CDR circuit 248 may be configured to delay or phase shift a receiver clock signal 270 to ensure that edges in the sampling clock signal 272 are timed to optimize sampling reliability.

In the illustrated wireless transceiver 240, the receiver clock signal 270 is derived from a received bus clock signal 274 from the clock channel 284. A differential receiver 252 coupled to the clock channel 284 may be configured to equalize the received bus clock signal 274, and a duty cycle correction circuit 250 may be used to adjust the duty cycle of the receiver clock signal 270. The receiver clock signal 270 is provided to a serializer 254 that is configured to convert n-bit parallel data elements, bytes or words into a serial data stream for transmission in a serialized data signal 264. The serialized data signal 264 may be preconditioned by a pre-equalizing circuit, such as the illustrated FFE 256, in order to combat or compensate for signal distortions attributable to ISI, reflection and other effects that can be expected to limit bandwidth in the second data channel 286. A preconditioned data signal 266 output by the FFE 256 is provided to a driver circuit 258 that is configured generate and transmit a differential transmit data signal 268 over the second data channel 286.

The illustrated modem 200 can be configured to process a data signal 232 received over the second data channel 286. The data signal 232 may be provided to a differential receiver 220, which may include or cooperate with an equalizing circuit. In one example, CTLE may be used to compensate for certain losses experienced in the second data channel 286. The second data channel 286 may be characterized in some respects as a low-pass filter. In the illustrated example, the differential receiver 220 outputs an equalized data signal 228 that is sampled by a slicer 218. The slicer 218 may be implemented using a D-flipflop or the like and may be configured to capture signaling state of the equalized data signal 228 under the control of edges in a sampling clock signal 234 generated by a CDR circuit 214. The output of the slicer 218 may be provided to a deserializer 216 that is clocked in accordance with one or more clock signals provided by the CDR circuit 214. The CDR circuit 214 may be configured to delay or phase shift a transmitter clock signal to ensure that edges in the sampling clock signal 234 are timed to optimize sampling reliability.

A clock generation circuit, including the illustrated phase locked loop 208, may generate multiple clock signals 236*a*, 236*b*, 236*c* used by the modem 200. One or more of the clock signals 236*a*, 236*b*, 236*c* may be a divided version of a base clock signal generated by the PLL 208. One or more of the clock signals 236*a*, 236*b*, 236*c* may be phase shifted with respect to the base clock signal. In one example, the serializer 202 may produce the serialized data signal 222 using timing provided by a first clock signal 236*a*. In another example, the bus clock signal 230 transmitted over the clock channel 284 may be derived from a second clock signal 236*b*. In some instances, a duty cycle correction circuit 210 may be used to adjust the duty cycle of the second clock signal 236*b* and to provide an input to a driver circuit 212 that is configured drive the clock channel 284. In another example, the CDR circuit 248 may generate the sampling clock signal 234 from a third clock signal 236*c*.

Figure 3:
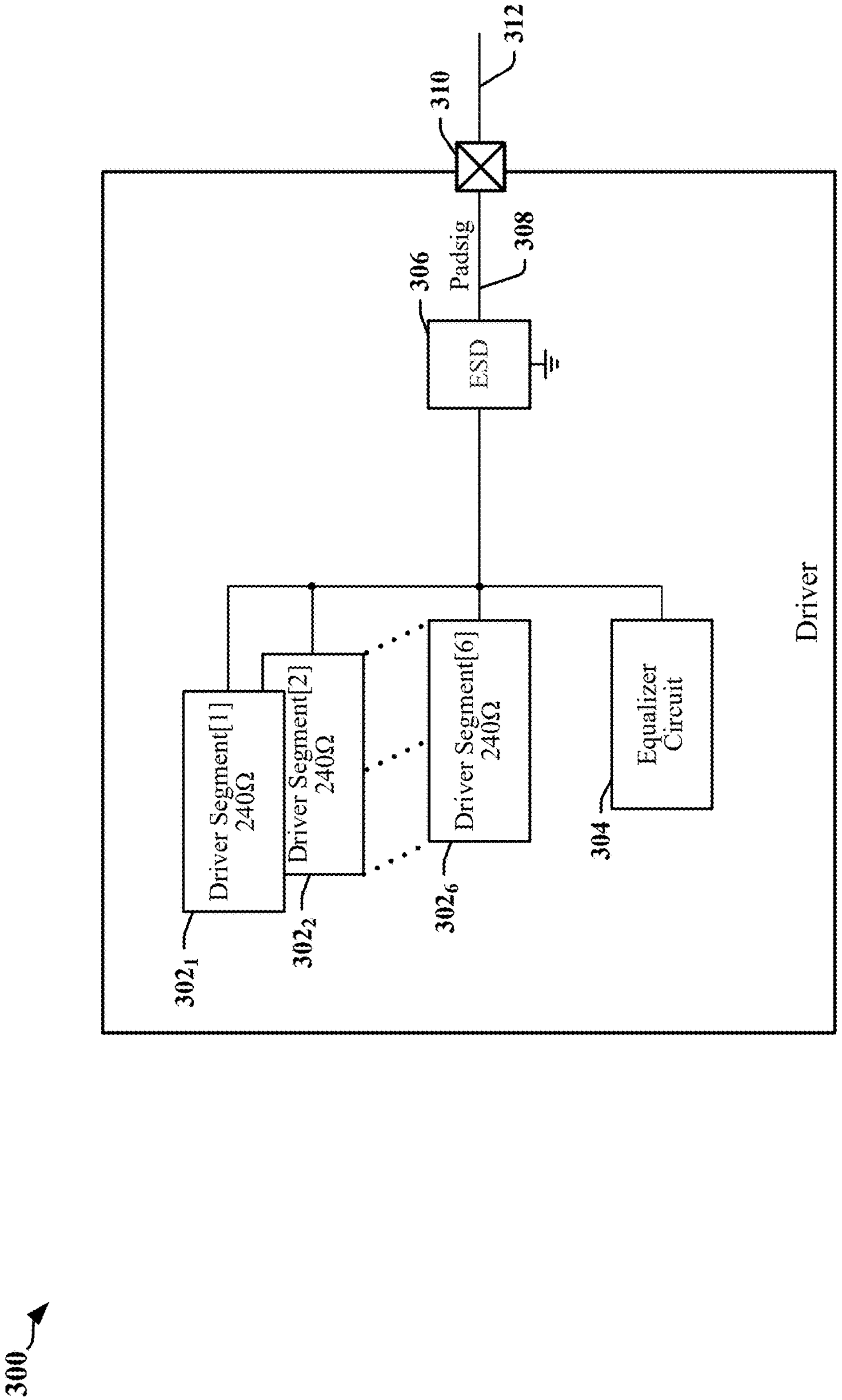
FIG. 3 illustrates certain features of a physical layer circuit in a high-speed data communication link.

Certain features of a physical layer driver circuit 300 are illustrated in FIG. 3. The driver circuit 300 may be coupled to an I/O terminal 310. The I/O terminal 310 may be coupled to a line 312 of a high-speed data communication link. In one example, the line 312 may be provided in a parallel bus that interconnects a memory controller and one or more memory devices. In another example, the line 312 may provide a transmission channel in a high-speed serial data-link. In the illustrated example, an ESD protection circuit 306 is coupled to the I/O terminal 310. For the purposes of this description, the I/O terminal 310 may correspond to a bonding pad in an IC device or SoC that facilitates bonding or contacting with a connecting wire or other interconnect.

The illustrated driver circuit 300 includes multiple driver segments $302_1$-$302_6$ and an equalizer circuit 304. The number of driver segments $302_1$-$302_6$ provided in the driver circuit 300 may be determined by the characteristics of the line 312 that is to be driven and the nature and value of termination at the transmitting and/or or receiving devices. In some applications the line 312 may be unterminated when low-power, lower-frequencies are transmitted. Lower frequency signals may be transmitted at higher voltage levels than higher frequency signals. Higher frequency signaling in certain applications may use signaling transmitted at near-ground voltage levels and line terminations may be provided.

The number of driver segments $302_1$-$302_6$ used to drive the line 312 may be calculated to provide a desired current or voltage level on the line 312. The number of driver segments $302_1$-$302_6$ used to drive the line 312 may be calculated to provide a desired termination impedance at the transmitting end of the line 312. The number and nature of the driver segments $302_1$-$302_6$ used to drive the line 312 may be selected to meet a specified or desired transition time of a signal (Padsig 308) to be transmitted over the line 312 through the I/O terminal 310. The number and type of driver segments $302_1$-$302_6$ used to drive the line 312 may be dynamically selected based on mode of operation.

The multiple driver segments $302_1$-$302_6$ in the driver circuit 300 may be configured to support different drive strengths and on-die DQ termination (ODT) requirements. In the illustrated example, each driver segment $302_1$-$302_6$ is calibrated to provide a pull-down impedance of 240 ohms. Pull-up may be calibrated to a nominal high output voltage ($V_{OH}$) target, which may be specified with reference to the output power rail voltage ($V_{LDO}$). $V_{OH}$ represents the minimum required voltage swing for a defined mode of operation. In one example, $V_{OH}=0.5*V_{LDO}$ for terminated lines and $V_{OH}=V_{LDO}$ for unterminated lines.

The bandwidth of the driver circuit 300 is limited by certain alternating current (AC) characteristics of the active driver segments $302_1$-$302_6$, the equalizer circuit 304, the ESD protection circuit 306 and the line 312 coupled to the I/O terminal 310, which can contribute to the I/O capacitance ($C_{IO}$) measured at the I/O terminal 310. $C_{IO}$ is typically a critical parameter and can limit AC performance at higher frequencies. The equalizer circuit 304 may be configured to offset certain effects of $C_{IO}$ and other parameters that may introduce distortion and non-linear response of the driver circuit 300 and line 312. In some examples, the equalizer circuit 304 may be configured to provide or approximate pre-emphasis in order to mitigate for channel loss and linear inter-symbol interference (ISI). ISI can distort signals when a pulse or an edge transmitted in a time interval (i.e., a unit interval or UI) is affected by a pulse or an edge transmitted in a preceding UI due to non-linear frequency response of the line 312, for example. The equalizer circuit 304 may be provided to enable the driver circuit 300 to operate at, or switch between standards-defined frequencies. For example, the driver circuit 300 may be operated at frequencies ranging between operate within the 200 Mhz and 6.4 GHz.

Limiting power consumption presents a major challenge in communication interfaces, including communication interfaces that include SERDES circuits. In mobile communication devices, reducing power consumption can increase battery life between charges. Accordingly, power consumption is a parameter that must be considered when physical layer (PHY) circuits are designed for communication interfaces that are required to meet ever-increasing demands for data rates and corresponding signaling rates associated with the communication interface. Demands for higher data rates and increased performance from SERDES-based PHY circuits are a consequence of continual advances in process technology and changing industry and proprietary standards. Moreover, PHY circuits are typically required to maintain backward compatibility to all previous generations of technology while supporting the higher data rates required by ever-evolving standards, necessitating increased numbers of transistors. The switching frequency of PHY circuits in communication interfaces can be a major factor in power consumption of an apparatus. For example, the operating frequencies of clock generation circuits for SERDES-based PHY circuits are determinative of maximum data rates.

Increasing demands for data throughput has required SERDES physical layer circuits to accommodate bandwidths that double every 3 years or so. Specifications and protocols associated with SERDES tend to have a long legacy, and "backward compatibility" requirements necessitate support for multiple generations of interfaces, and requires SERDES physical layer circuits to handle a wide range of data rates. SERDES physical layer circuits typically support two or more modes of operation, including a high-performance mode and a low-power mode. High-performance mode may be implemented to support high data transmission rates with associated high levels of power consumption. Low-power mode may be implemented to reduce power consumption by transmitting data at lower data rates. Many applications require SERDES physical layer circuits to support both high-performance mode and low-power mode and to be able to switch between modes on command.

Figure 4:
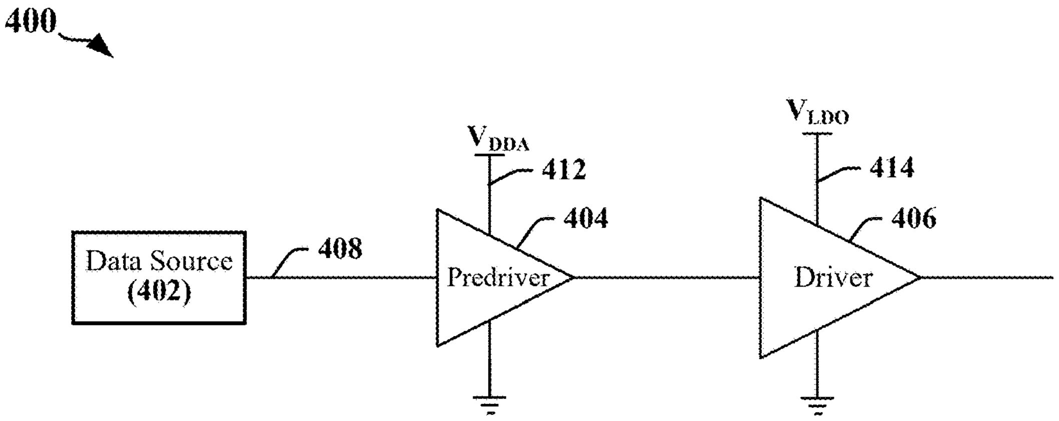
FIG. 4 illustrates certain aspects of a driver circuit that is configurable to function in different operating modes.
Figure 4:
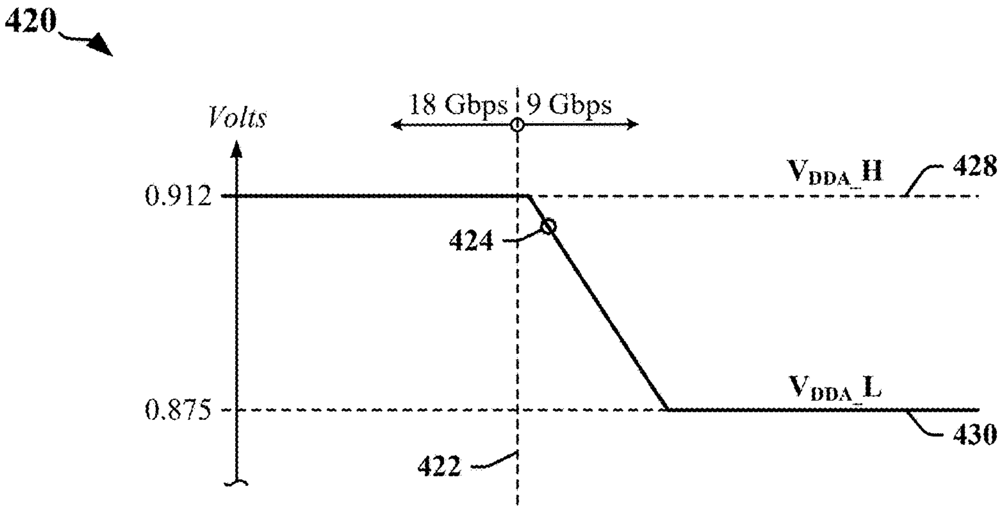

FIG. 4 illustrates certain aspects of a driver circuit 400 that is configurable to function in different operating modes. The driver circuit 400 is implemented in an integrated circuit and is illustrated in a high-level schematic form. The driver circuit 400 includes a predriver 404 and a line driver 406. The predriver 404 receives a data signal 408 from a data source 402 that is typically resident within the core of the integrated circuit. Accordingly, the predriver 404 is coupled to a core power rail 412 and receives power at a voltage level ($V_{DDA}$) used by core circuits. The predriver 404 may condition the data signal 408 in order to drive the line driver 406, which operates at the input/output (I/O) voltage level ($V_{LDO}$). The voltage level of $V_{LDO}$ may be configured based on the mode of operation enabled for the driver circuit 400.

The line driver **406*a* receives power from an I/O power rail 414 at $V_{LDO}$. For the purposes of this disclosure, the core voltage power supply rail in a memory device may be referred to as $V_{DDA}$ and the lowest voltage power supply rail may be referred to system ground (GND) or $V_{SSX}$. The graph 420 in FIG. 4 illustrates voltage ramping associated with a change in bus interface operating frequency. At a certain point in time 422, the data rate defined for the bus interface switches from 18 gigabits per second (Gbps) to 9 Gbps. A voltage ramp 424 is initiated to reduce $V_{DDA}$ from a first core voltage level 428 ($V_{DDA}$_H) to a second core voltage level 430** ($V_{DDA}$_L).

Certain challenges are associated with the design of PHY circuits for high data rate communication interfaces that can switch between both high-performance and low-power modes of operation. Calibration circuits and procedures may be implemented to configure impedance of a driver circuit for high performance and low-power operation and to mitigate against the effects of variations in manufacturing process, circuit supply voltage, and die temperature (PVT). For the purposes of this disclosure, PVT corners represent limits of process, voltage, or temperature and/or combinations thereof. PVT corners may be correlated with limits of operational characteristics of a circuit, including current, voltage, temperature, switching frequency, rise time, fall time, and other characteristics. Impedance matching can be maintained or readily achievable for all expected PVT corners when the disclosed calibration circuits and techniques are implemented.

Figure 5:
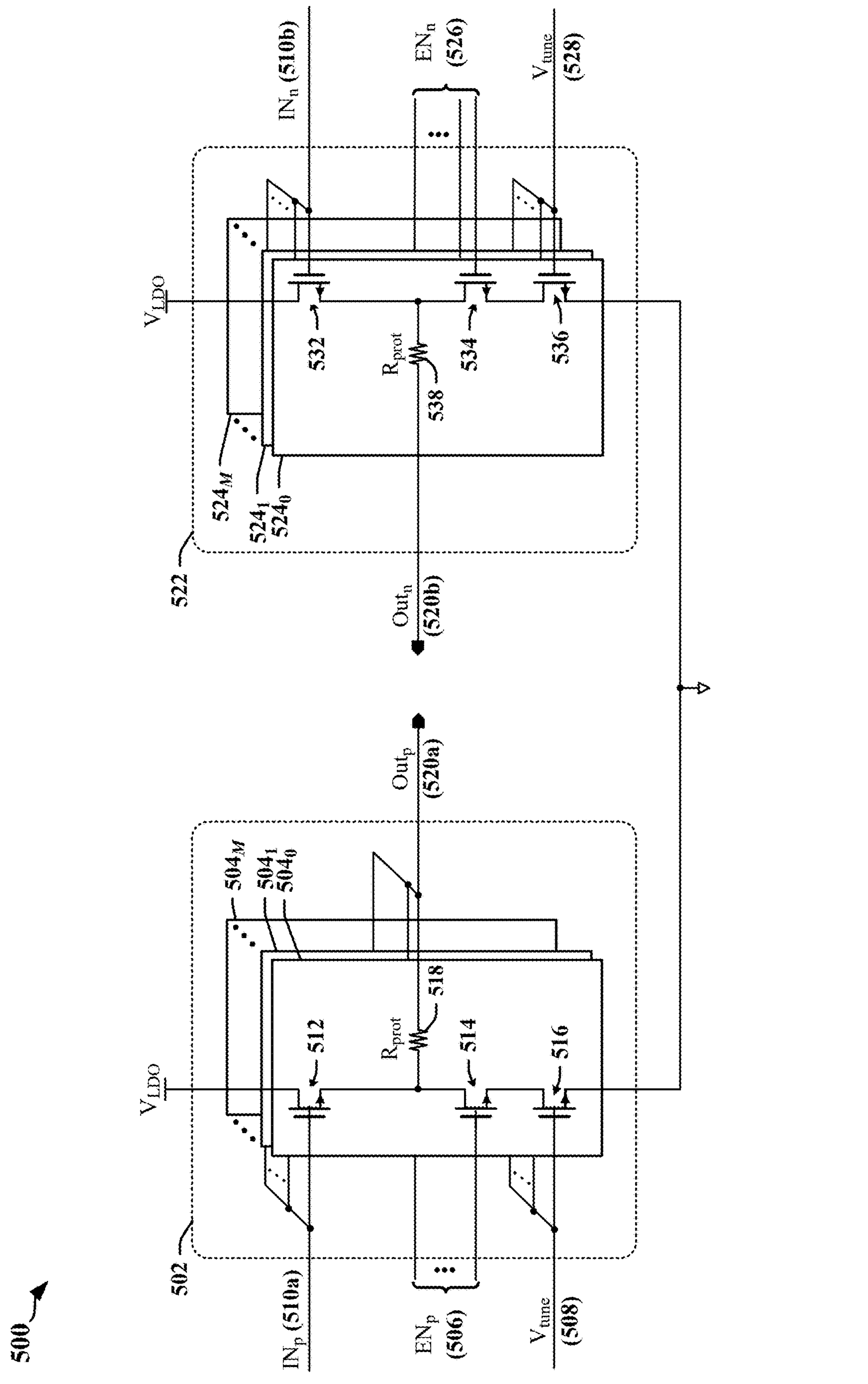
FIG. 5 illustrates an example of a driver circuit in a high data rate communication interface that can be adapted in accordance with certain aspects of this disclosure.

FIG. 5 illustrates an example of a driver circuit 500 that can be provided in a high data rate communication interface. In some instances, the PHY circuit may support SERDES-based communications. The illustrated driver circuit 500 can operate as a differential driver that receives a differential input signal and produces a differential output signal. The differential input signal includes an in-phase input signal (the $In_p$ signal 510*a*) and an inverse input signal (the $In_a$ signal 510*b*). The differential output signal includes an in-phase output signal (the $Out_p$ signal 520*a*) and an inverse output signal (the $Out_n$ signal 520*b*). A first output stage 502 may be configured to receive the $In_p$ signal 510*a* and produce the $Out_p$ signal 520*a*, while a second output stage 522 may be configured to receive the $In_n$ signal 510*b* and produce the $Out_n$ signal 520*b*. Each output stage 502, 522 includes a configurable number of driver segments $\mathbf{504_0}$-$\mathbf{504_M}$, $\mathbf{524_0}$-$\mathbf{524_M}$. The driver segments $\mathbf{504_0}$-$\mathbf{504_M}$, $\mathbf{524_0}$-$\mathbf{524_M}$ may also be referred to as driver subcircuits or driver slices. The quantity of driver segments $\mathbf{504_0}$-$\mathbf{504_M}$, $\mathbf{524_0}$-$\mathbf{524_M}$ that are enabled during operation can be configured to provide a desired output impedance for the corresponding output stage 502, 522 and/or for the driver circuit 500. In some implementations, an identical number of driver segments $\mathbf{504_0}$-$\mathbf{504_M}$ or $\mathbf{524_0}$-$\mathbf{524_M}$ are enabled in each output stage 502, 522. In some implementations, the number of enabled driver segments $\mathbf{504_0}$-$\mathbf{504_M}$ or $\mathbf{524_0}$-$\mathbf{524_M}$ for each output stage 502, 522 can be configured independently.

Each of the output stages 502, 522 in the illustrated driver circuit 500 includes a number (M) of driver segments $\mathbf{504_0}$-$\mathbf{504_M}$, $\mathbf{524_0}$-$\mathbf{524_M}$. Each of the driver segments $\mathbf{504_0}$-$\mathbf{504_M}$ is implemented as shown for the first illustrated driver segment $\mathbf{504_0}$ and each of the driver segments $\mathbf{524_0}$-$\mathbf{524_M}$ is implemented as shown for the second illustrated driver segment $\mathbf{524_0}$. In the illustrated driver circuit 500, the gate of a drive transistor 512 in the first illustrated driver segment $\mathbf{504_0}$ is coupled to the $In_p$ signal 510*a* and the source of this drive transistor 512 is configured to drive the $Out_p$ signal 520*a*, when enabled. Each of the other driver segments $\mathbf{504_1}$-$\mathbf{504_M}$, like the first illustrated driver segment $\mathbf{504_0}$, includes an input transistor that is coupled in parallel with the drive transistor 512 in the first illustrated driver segment $\mathbf{504_0}$. The gate of a drive transistor 532 in the second illustrated driver segment $\mathbf{524_0}$ is coupled to the $In_a$ signal 510*b* and the source of this drive transistor 532 is configured to drive the $Out_n$ signal 520*b*, when enabled. Each of the other driver segments $\mathbf{524_1}$-$\mathbf{524_M}$, like the second illustrated driver segment $\mathbf{524_0}$, includes an input transistor that is coupled in parallel with the drive transistor 532 in the second illustrated driver segment $\mathbf{524_0}$.

Multibit enable signals 506, 526 may be used to select the driver segments $\mathbf{504_0}$-$\mathbf{504_M}$, $\mathbf{524_0}$-$\mathbf{524_M}$ to be enabled. In various examples, the multibit enable signals 506, 526 are encoded with a control codeword. The control codeword may be encoded using binary or unary encoding. Binary encoding may be used to specify the numerical quantity of driver segments $\mathbf{504_0}$-$\mathbf{504_M}$, $\mathbf{524_0}$-$\mathbf{524_M}$ to be enabled. Unary encoding, which may be referred to as thermometer encoding, represents data in the quantity of bits set to '1' that precede a terminating '0', or the quantity of bits set to '0' that precede a terminating '1'. Thus, in one embodiment, a total current flowing through the protection resistors (e.g., $R_{prot}$ 518 and 538) that couple driver segments $\mathbf{504_0}$-$\mathbf{504_M}$ or $\mathbf{524_0}$-$\mathbf{524_M}$ to the $Out_p$ signal 520*a* $Out_n$ signal 520*b* is controlled using thermometer coding in which the number of ones in the code selects a number of segments to be turned on. Protection resistors may be provided to limit current flowing through the drive transistors 512, 532.

An operating point of the driver segments $\mathbf{504_0}$-$\mathbf{504_M}$, $\mathbf{524_0}$-$\mathbf{524_M}$ may be controlled by tuning signals (e.g., the $V_{tune}$ signals 508, 528), which may define the current flowing through the driver segments $\mathbf{504_0}$-$\mathbf{504_M}$, $\mathbf{524_0}$-$\mathbf{524_M}$, the output impedance of the driver segments $\mathbf{504_0}$-$\mathbf{504_M}$, $\mathbf{524_0}$-$\mathbf{524_M}$, or the like. Output impedance for each segment $\mathbf{504_0}$-$\mathbf{504_M}$, $\mathbf{524_0}$-$\mathbf{524_M}$ may be calculated as the sum of the impedance associated with a drive transistor 512, 532 and the corresponding $R_{prot}$ 518 and 538. In the illustrated example, $V_{tune}$ signals 508 and 528 may control a bias transistor 516, 536 in the corresponding driver segment $\mathbf{504_0}$, $\mathbf{524_0}$.

In the illustrated driver circuit 500, the NMOS transistors 512, 514 and 516 in the first illustrated driver segment $\mathbf{504_0}$ are coupled in series between $V_{LDO}$ and ground. The drive transistor 512 that has a gate controlled by an in-phase input signal 510*a* and a drain that is coupled to $V_{LDO}$. Transistor 514 is turned on when an enable signal (i.e., one bit of the multibit enable signal 506) is in an active state. When the transistor 514 is turned on, the drive transistor 512 responds to the in-phase input signal 510*a* and pulls the $Out_p$ signal 520*a* toward $V_{LDO}$ through $R_{prot}$ 518 and/or impedance provided in the first segment $\mathbf{504_0}$. In one example, the output impedance provided by the combination of active or enabled drive transistors in the segments $\mathbf{504_0}$-$\mathbf{504_M}$ may be calibrated to 50 ohms. Transistor 516 may be configured to match the impedance of the drive transistor 512 using the $V_{tune}$ signal 508 to tune the gate voltage of transistor 516. Transistors 514, 516 are typically manufactured using a sufficiently large geometry to enable the transistors 514, 516 to support gate-source voltages that are less than VDD. The resultant circuit can exhibit high power consumption and sub-optimal jitter performance.

Each of the driver segments $\mathbf{504_0}$-$\mathbf{504_M}$, $\mathbf{524_0}$-$\mathbf{524_M}$ is similarly configured. Each of the driver segments $\mathbf{504_0}$-$\mathbf{504_M}$, $\mathbf{524_0}$-$\mathbf{524_M}$ may be selectively enabled or activated based on signaling state of the corresponding multibit enable signal 506, 526.

The illustrated driver circuit 500 is provided as an example and other driver circuit designs may be implemented using different circuits and/or circuit components. In the illustrated example, the driver segments $\mathbf{504_0}$-$\mathbf{504_M}$, $\mathbf{524_0}$-$\mathbf{524_M}$ are implemented using NMOS transistors 512, 514 and 516. In other examples, the driver segments $\mathbf{504_0}$-$\mathbf{504_M}$, $\mathbf{524_0}$-$\mathbf{524_M}$ may be implemented using PMOS transistors. In some examples, the driver segments $\mathbf{504_0}$-$\mathbf{504_M}$, $\mathbf{524_0}$-$\mathbf{524_M}$ may be implemented using some combination of NMOS and PMOS transistors. In some implementations, dedicated resistive components may be included in the driver segments $504_0$-$504_M$, $524_0$-$524_M$.

An output driver in a high-speed interface, including the illustrated driver circuit 500, may be configured or calibrated to provide a desired output impedance for a range of expected PVT variations. For example, the output voltage specified for the driver circuit 500 may vary due to operating conditions, modes of operation defined by power-management circuits or power budgets, which can vary the output voltage levels and switching speed defined for the driver circuit that necessitate increased or reduced output voltage levels. The output impedance of the driver circuit may be configured by selecting the number of driver segments that are enabled and configured to actively drive an output of the driver circuit. The output impedance of the driver circuit includes the parallel combination of impedances provided by enabled driver segments. In one example, the enabled driver segments contribute a combined termination resistance of (R/S) to the output impedance of the driver circuit, where R represents the output resistance provided by each of S enabled driver segments.

In one example, specifications for a communication link may require a driver circuit provide a resistive termination impedance of 80 ohms. In another example, a resistive termination impedance of 100 ohms may be required. In the latter example, a differential driver circuit may be configured or calibrated to drive each complementary signal using a quantity (S) of enabled driver segments to provide a 50 ohms termination impedance across expected PVT variations. The value of S may be configured during and impedance calibration procedure during system initialization, configuration or calibration, and can be reconfigured under application control.

According to certain aspects of this disclosure, termination resistance ($R_{Term}$) of a driver circuit can be calculated as $R_{Term}$=R/S, where R represents the output resistance provided by each of S enabled driver segments. The termination resistance of the driver circuit 500 may be a function of $V_{LDO}$ and can vary as $V_{LDO}$ is varied. Significant testing overhead may be required to accommodate variations in $V_{LDO}$.

Figure 6:
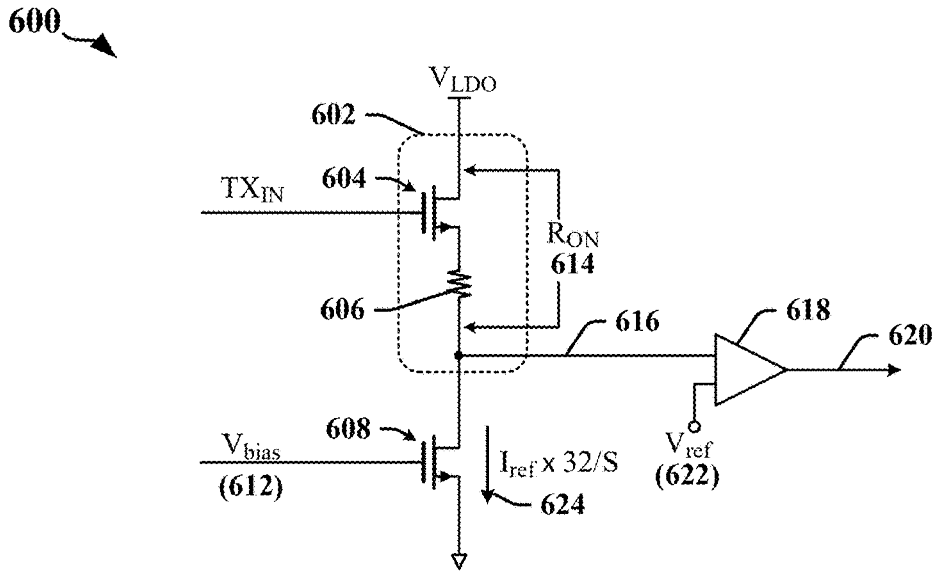
FIG. 6 illustrates examples of calibration circuits that may be used to calibrate the driver circuit illustrated in FIG. 5.
Figure 6:
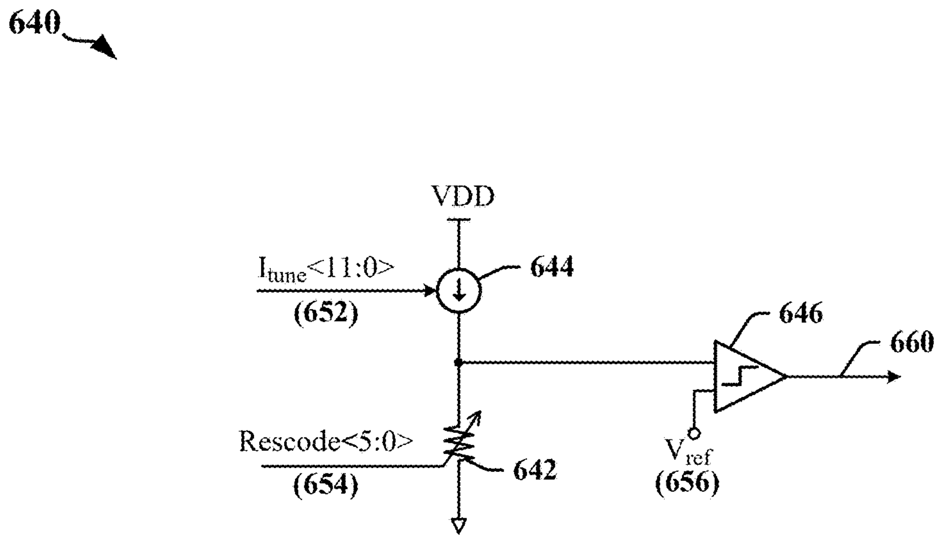

FIG. 6 illustrates examples of calibration circuits 600, 640 that may be used to calibrate the driver circuit 500 illustrated in FIG. 5. Each calibration circuit 600, 640 employs a replica of one or more drive transistor to generate a tuning signal. In one examples, a replica of the drive transistor 512 is used with a resistor to replicate the effects of resistive devices and/or parasitic components in the output of the driver segments $504_0$-$504_M$, $524_0$-$524_M$ in the driver circuit 500 illustrated in FIG. 5.

A first calibration circuit 600 has a replica output stage 602 that is a partial replica and includes a replica transistor 604 and a resistor 606. The replica transistor 604 may be a replica of the drive transistor 512 or 532 in the driver circuit 500 illustrated in FIG. 5. The resistor 606 may represent resistive components in a corresponding driver segment. The replica output stage 602 provides an output resistance 614 ($R_{ON}$) when the replica output stage 602 is enabled. A voltage comparator 618 compares the voltage level at the output 616 of the replica output stage 602 with a reference voltage level ($V_{ref}$ 622). $V_{ref}$ 622 may be obtained using a bandgap voltage reference (VBG) that is based on the band gap voltage associated with the semiconductor on which the driver circuit is provided. Bandgap voltage can provide a stable, nearly constant voltage reference level. In certain implementations, $V_{ref}$ 622 is a multiple of the bandgap voltage reference.

The voltage level at the output 616 of the replica output stage 602 can be tuned by varying the bias voltage ($V_{bias}$ 612) provided to the gate of transistor 608 until the output 620 of the voltage comparator 618 switches between signaling states. The current 624 flowing through transistor 608 determines the voltage drop across the replica output stage 602. $V_{bias}$ 612 is configured to produce a current 624 that is a fraction of a reference current level ($I_{ref}$) that is calculated to produce the desired termination resistance of the driver circuit. In the illustrated example, the amplitude of the current may be calculated as $I_{ref}$×32/S, when S of 32 driver segments are turned on. For each driver segment the output resistance 614 of the replica output stage 602 may be calculated as:

$$R_{ON} = \frac{V_{LDO} - V_{ref}}{I_{ref} \times (32/S)} = \frac{S \times (V_{LDO} - V_{ref})}{32 \times I_{ref}},$$

and the termination impedance of the driver circuit may be calculated as:

$$R_{Term} = \frac{V_{LDO} - V_{ref}}{I_{ref}}.$$

As demonstrated by these equations, the termination resistance of the illustrated driver circuit can vary with changes in $V_{LDO}$ and/or $I_{ref}$.

A second calibration circuit 640 has a current source 644 and a configurable resistance 642 that replicates the resistance provided by the driver segments $504_0$-$504_M$, $524_0$-$524_M$ illustrated in FIG. 5. In the illustrated example, the current source 644 is configured by a tuning signal (the $I_{tune}$ signal 652) that is encoded with a twelve-bit current control value. The configurable resistance 642 is configured by a control signal (the Rescode signal 654) that is encoded with a six-bit control value. The configurable resistance 642 may be configured to have a nominal resistance value that is specified for the resistance provided by the driver segments $504_0$-$504_M$, $524_0$-$524_M$ illustrated in FIG. 5. In some implementations, the configurable resistance 642 can be configured to have the nominal resistance value specified for the termination resistance provided by the driver circuit 500 illustrated in FIG. 5. The current source 644 may be incrementally adjusted until the voltage across the configurable resistance 642 most closely matches a reference voltage level ($V_{ref}$ 656). $V_{ref}$ 656 may be obtained using a bandgap voltage reference (VBG) that is based on the band gap voltage associated with the semiconductor on which the driver circuit is provided.

A voltage comparator 646 compares the voltage level across the configurable resistance 642 with $V_{ref}$ 656. In one example, the current source 644 is incrementally adjusted until the output 660 of the voltage comparator 646 switches between signaling states. The second calibration circuit 640 is typically required to tune the current source 644 to track $V_{LDO}$ and obtain different voltage levels across the configurable resistance 642. This can result in significant testing overhead to accommodate a $V_{LDO}$ that may vary according to application and/or PVT conditions.

Certain aspects of the present disclosure relate to systems, circuits and methods that can be used to calibrate drivers in a high-speed communication interface. The tight calibration provided by these systems, circuits and methods can reduce the physical area of a semiconductor die needed to manufacture high-speed output drivers by reducing the size of transistors and resistances that are required. For example, tight calibration of resistance enables the use of smaller protection resistors (see, e.g., $R_{prot}$ 518 and 538 in FIG. 5) in the output stage. The use of smaller-sized transistors and resistances can limit or reduce resistance variations attributable to PVT variances. The use of smaller-sized transistors can improve jitter performance.

Advances in process technology can be expected to require tight calibration of circuits. For example, smaller geometry technology and certain manufacturing techniques, such as liquid epitaxy, can produce significant variations of output driver resistance due to relative sizes of vias and due to variations in metal resistance. In one example, resistance at typical PVT corners can vary by at least ±15% due to process variations alone. Resistance in TT corner varies from −/+15% for LPE variations alone. Variations in resistance values can be expected to increase as operating voltage is lowered.

Figure 7:
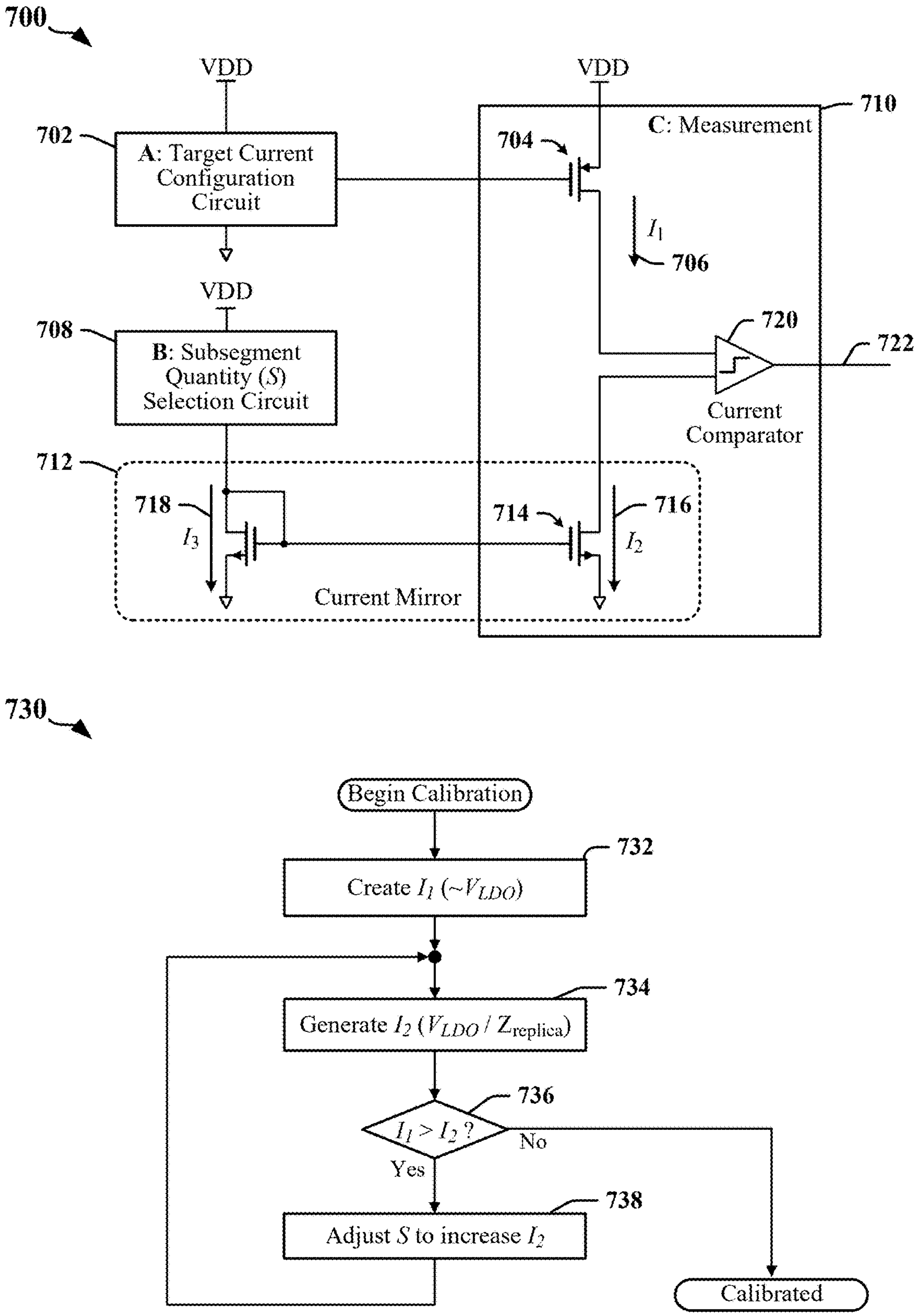
FIG. 7 includes a block schematic of a calibration circuit that may be implemented in accordance with certain aspects of this disclosure.

FIG. 7 includes a block schematic of a calibration circuit 700 that may be implemented in accordance with certain aspects of this disclosure. The calibration circuit 700 may be used to calibrate an output driver. The illustrated calibration circuit 700 includes three sections that cooperate to configure driver segments in the output driver. For the purposes of this disclosure, driver segments can also be referred to as driver slices or driver subcircuits. In the illustrated example, the Section A circuits 702 and the Section B circuits 708 may generate and/or configure calibration currents 706, 716 flowing in transistors 704, 714 of the Section C circuits 710, respectively. The Section C circuits 710 include a current comparator 720. The calibration currents 706, 716 are provided to inputs of the current comparator 720, which may be configured to provide an output 722 that indicates which of the calibration current 706 or 716 has a greater amplitude.

Section A circuits 702 may be configured to provide a first calibration current 706 that is representative of the driver output current to be produced in a specified termination impedance at a specified $V_{LDO}$ voltage level. In one example, the amplitude of the first calibration current 706 corresponds to the amplitude of current flowing through the output of a single driver segment in the output driver for operation with the specified termination impedance and $V_{LDO}$ voltage level. In another example, the amplitude of the first calibration current 706 corresponds to a multiple of the amplitude of current flowing through the output of a driver segment in the output driver. In another example, the amplitude of the first calibration current 706 equals or approximates the amplitude of driver output current produced in the specified termination impedance at the specified $V_{LDO}$ voltage level. In another example, the amplitude of the first calibration current 706 corresponds to a fraction of the amplitude of driver output current produced in the specified termination impedance at the specified $V_{LDO}$ voltage level.

Section B circuits 708 may be configured to provide a second calibration current 716 that is representative of the combined current produced when a number (S) of driver segments in the output driver are enabled. In one example, the amplitude of the second calibration current 716 corresponds to the amplitude of current produced by one enabled driver segment. In another example, the amplitude of the second calibration current 716 corresponds to the amplitude of current produced by a fraction of the S enabled driver segments. In another example, the amplitude of the second calibration current 716 corresponds to the amplitude of current produced by S enabled driver segments.

The configuration of the three sections can be coordinated such that the currents 706, 716 being measured are expected to be equal within predefined tolerances when calibration is accomplished. In some implementations, Section C circuits 710 may be predefined by design, preconfigured or have a fixed configuration, while Section A circuits 702 and Section B circuits 708 may be configured based on application and/or operating conditions to produce calibration currents 706, 716 that are scaled identically.

In some implementations, the Section B circuits 708 of the calibration circuit 700 illustrated in FIG. 7 include a full replica of the output stage of a driver segment to find the value of S. In the example of a defined termination resistance of 100 ohms, the number of enabled driver segments may be increased from a selected minimum or decreased from a selected maximum until the signaling state of the output 722 of the current comparator 720 changes. The signaling state of the output 722 of the current comparator 720 may be expected to switch when:

$$\frac{R_{LSB}}{S} = 100,$$

for the defined termination resistance of 100 ohms, where $R_{LSB}$ represents the output resistance of a single driver segment. $R_{LSB}$ also represents the termination resistance of the output driver when S=1. In one example, $R_{LSB}$ also corresponds to termination resistance of the output driver when only the least significant bit (LSB) is set in a code value used to enable driver segments.

In some implementations, a current mirror 712 is used to reproduce the current 718 ($I_3$) produced by the Section B circuits 708 of the calibration circuit 700 as the second calibration current 716. The current mirror 712 may be used to ensure that loading by the current comparator 720 does not affect the operation of the Section B circuits 708. The current mirror 712 includes at least one transistor 714 that has a drain coupled to the current comparator 720.

The flow diagram 730 in FIG. 7 illustrates certain aspects of the operation of the calibration circuit 700. A calibration procedure may commence by configuring a parameter (S) representing the number of enabled driver segments. In one example, S is initially set to a minimum value and S can be increased after each comparison of the calibration currents 706, 716 until $I_2>I_1$, where $I_1$ represents the first calibration current 706 and $I_2$ represents the second calibration current 716. In another example, S is initially set to a maximum value and S can be decreased after each comparison of the calibration currents 706, 716 until $I_2<I_1$.

Figure 8:
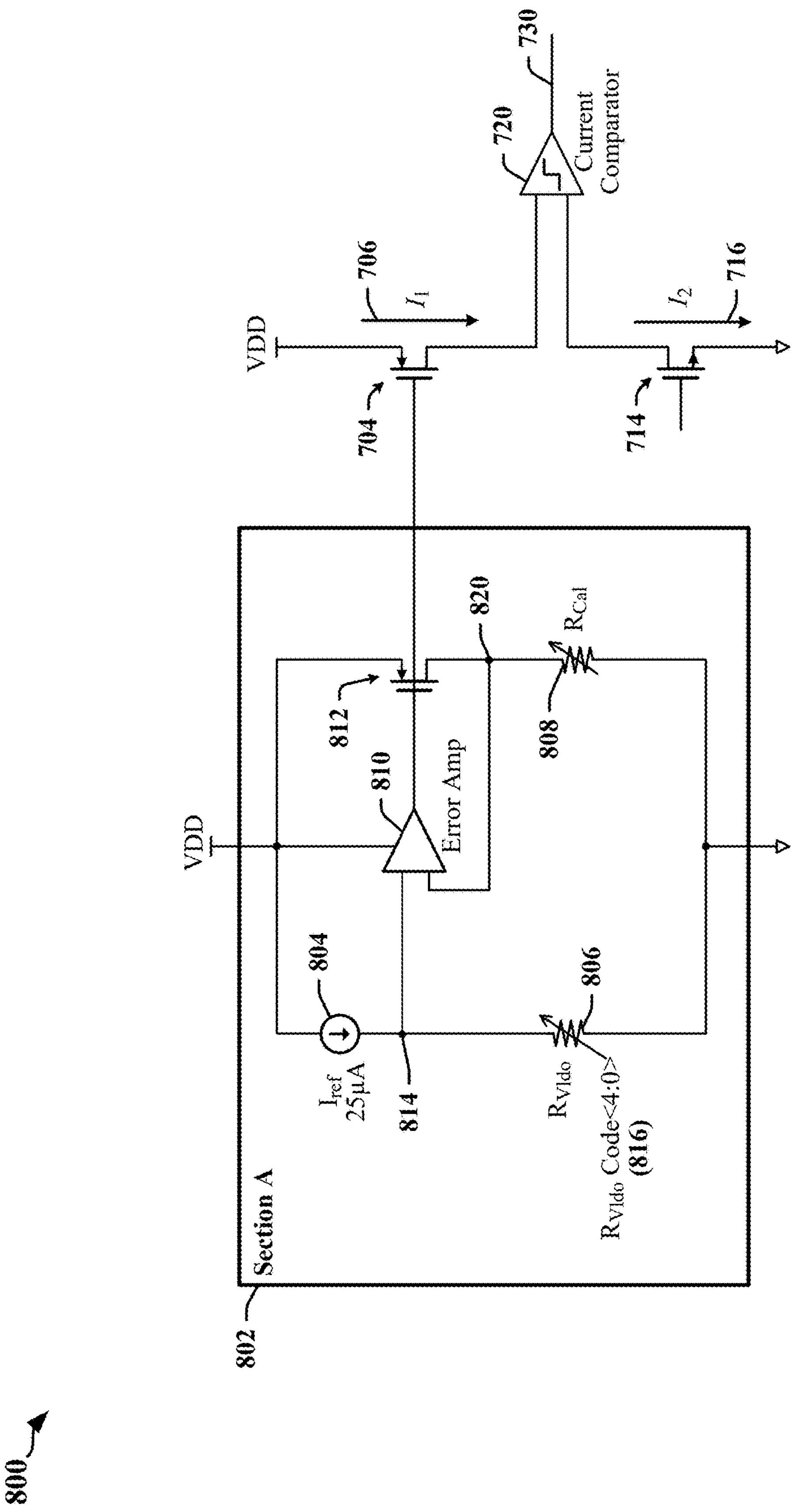
FIG. 8 illustrates a first example of a calibration circuit that may be configured or adapted in accordance with certain aspects of this disclosure.
Figure 10:
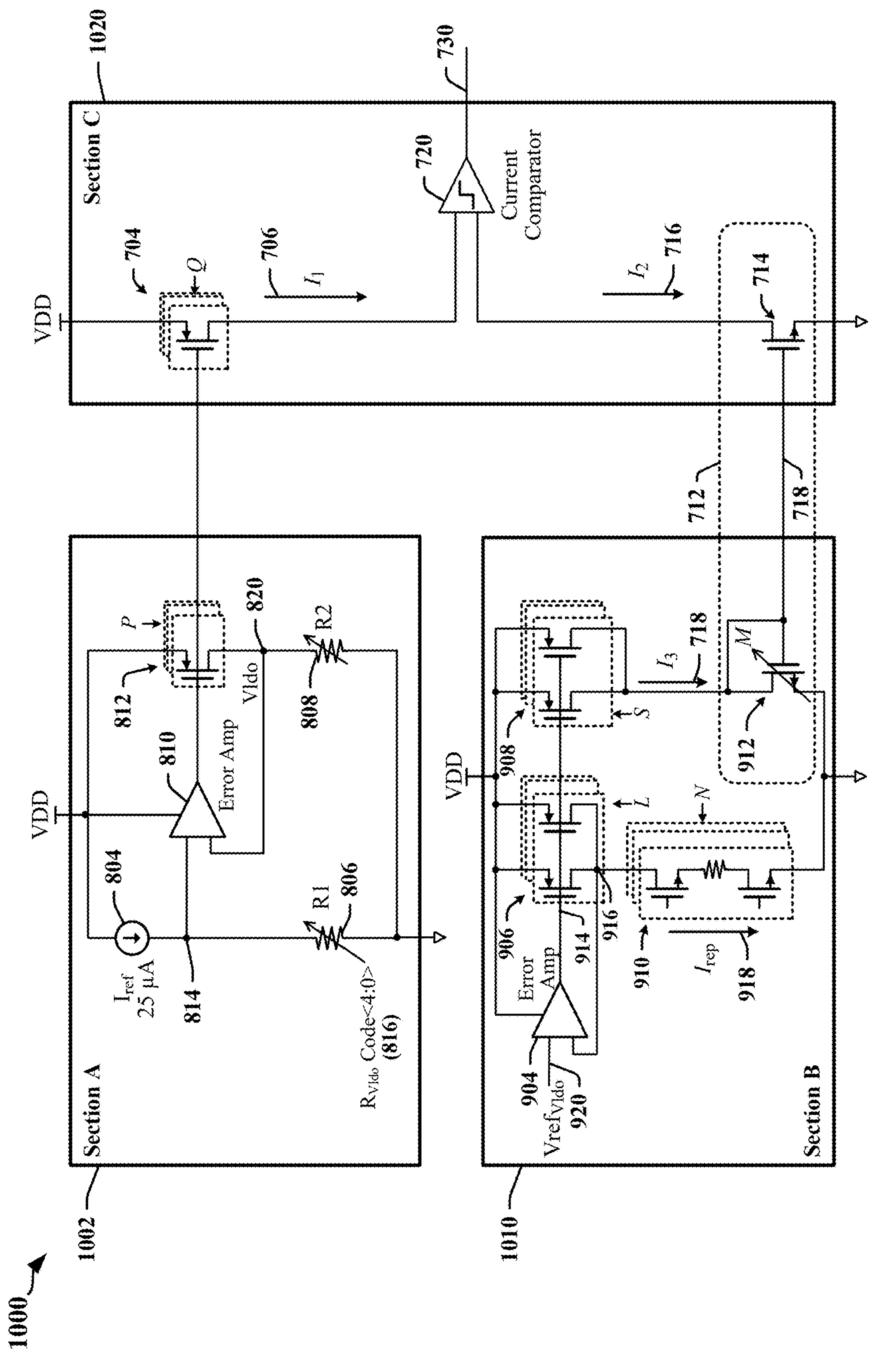
FIG. 10 illustrates an example of a calibration system implemented in accordance with certain aspects of this disclosure.

At block 732, the amplitude of $I_1$ is configured using the Section A circuits 702. Example implementations of the Section A circuits 702 are illustrated in FIGS. 8 and 10. The amplitude of $I_1$ is configured to represent the driver output current to be produced in a specified termination impedance at a specified $V_{LDO}$ voltage level. The amplitude of $I_1$ may be configured to be nominally or approximately equal to the driver output current. In some implementations, the amplitude of $I_1$ is a scaled version of the driver output current.

Figure 9:
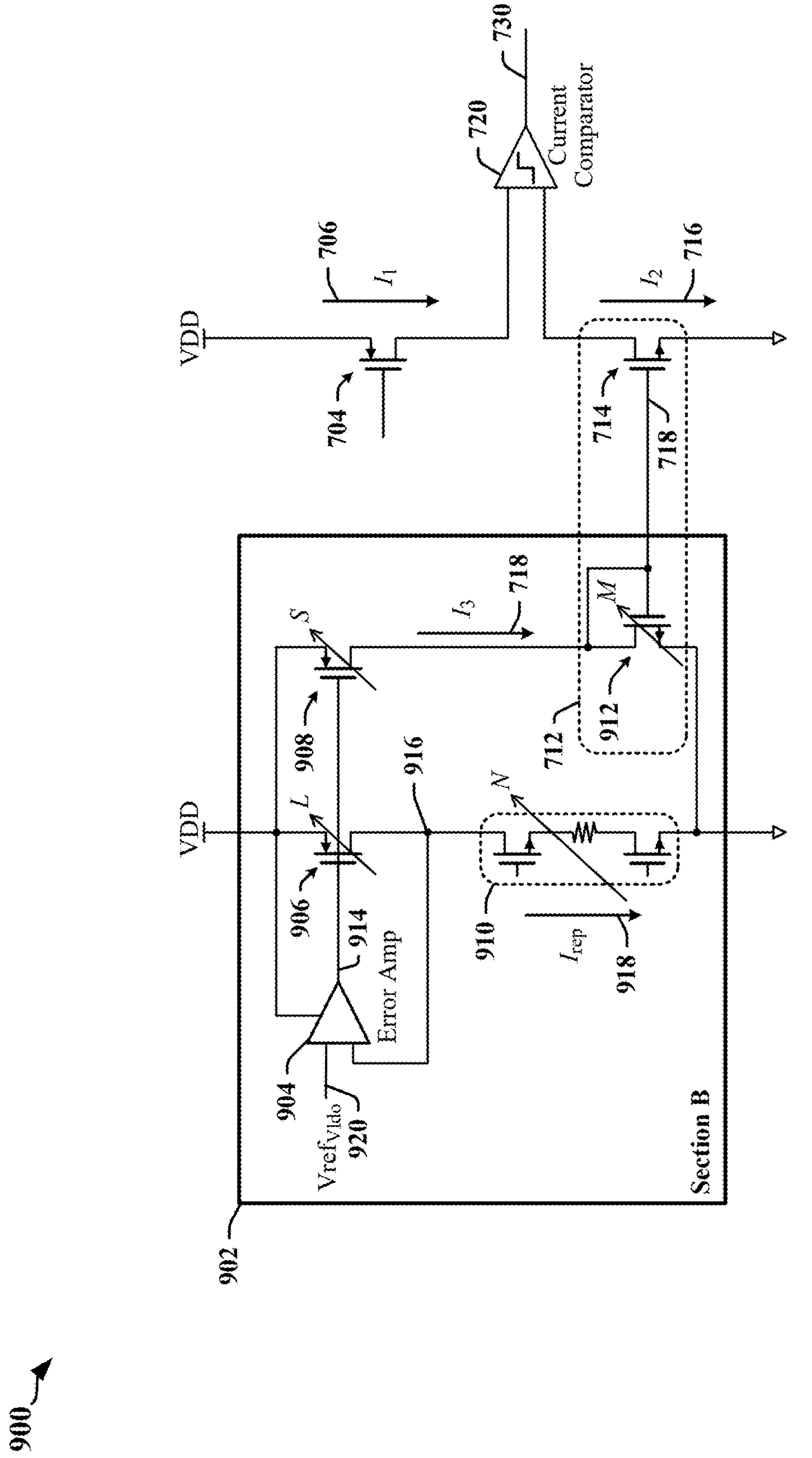
FIG. 9 illustrates a second example of a calibration circuit that may be configured or adapted in accordance with certain aspects of this disclosure.

At block 734, $I_2$ is generated by the Section B circuits 708 of the calibration circuit 700 illustrated in FIG. 7 as a representation of the current expected to be produced by S enabled driver segments in the output driver. Example implementations of the Section B circuits 708 of the calibration circuit 700 illustrated in FIG. 7 are illustrated by FIGS. 9 and 10. The amplitude of $I_2$ may be configured to be nominally or approximately equal to the current produced by S enabled driver segments. In some implementations, the amplitude of $I_2$ is a scaled version of the current be produced by S enabled driver segments.

At block 736, $I_1$ and $I_2$ are compared. In the illustrated example, calibration is complete when $I_1$ is no longer greater than $I_2$. In this example, S is initially set to a minimum value and the current be produced by S enabled driver segments is expected or configured to be less than the driver output current. Since $I_1$ represents the driver output current and $I_2$ represents the current produced by S enabled driver segments, initially $I_1>I_2$. In implementations that initialize S to a maximum value, block 736 may be modified to test whether $I_1<I_2$. The comparison of $I_1$ with $I_2$ in block 736 may be performed using the current comparator 720, where a change in signaling state of the output 722 of the current comparator 720 signals completion of calibration.

If, at block 736, it is determined that $I_1>I_2$, then $I_2$ may be increased at block 738 and the process continues at block 734. In certain implementations, $I_2$ may be increased by increasing the number of driver segments used to produce $I_2$. In some implementations, $I_2$ may be increased by modifying a scaling factor used to produce $I_2$.

FIG. 8 illustrates an example of a calibration circuit 800 that may be configured or adapted in accordance with certain aspects of this disclosure. The calibration circuit 800 includes a section 802 that includes circuits that correspond in some respects to the Section A circuits 702 of the calibration circuit 700 illustrated in FIG. 7. A current source 804 and a first variable resistor 806 ($R_{Vldo}$) may be configured to generate a reference voltage that is nominally equal to $V_{LDO}$. In the illustrated example, a 25 μA current produced by the current source 804 passes through the first variable resistor 806. The first variable resistor 806 is configured or programmed by a control code with a resistance value that causes a voltage drop across the first variable resistor 806. The voltage drop is nominally equal to $V_{LDO}$. A control code 816 may be configured to define the resistance value of the first variable resistor 806. In the illustrated example, the control code 816 encodes a 5-bit value that supports a range of values for Vldo. In some implementations, the current source 804 and the first variable resistor 806 can be independently calibrated.

A first node 814 is coupled to the output of the current source 804, to the first variable resistor 806 and to an input of an error amplifier 810. The voltage at the node 814 is defined by the voltage drop across the first variable resistor 806 and may change in proportion to $V_{LDO}$ as the value encoded by the control code 816 changes. In the illustrated example, the output of the error amplifier 810 is coupled to the gate of at least one active or enabled PMOS transistor 812. The source of the active or enabled PMOS transistor 812 is coupled to the VDD power rail. The drain of the active or enabled PMOS transistor 812 is coupled through a second node 820 to a second variable resistor 808. The voltage at the second node 820 is fed back to the error amplifier 810 such that the voltage at the second node 820 follows the voltage at the first node 814. In the illustrated example, the voltage at the second node 820 defined by the first variable resistor 806 is equal to $V_{LDO}$.

In some implementations, the second variable resistor 808 is used to represent the termination resistance defined for the output driver. In some implementations, the second variable resistor 808 may be tuned to provide a resistance that is different from or not proportionate to the termination resistance defined for the output driver. In some implementations, the second variable resistor 808 provides a fixed resistance or a resistance configured during system integration or initialization. A control code may be configured to define the resistance value of the second variable resistor 808. In certain implementations, the control code configures the resistance value of the second variable resistor 808 such that the amplitude of the first calibration current 706 equals or approximates the amplitude of a nominal output current of the output driver that flows through the specified termination impedance at the specified $V_{LDO}$ voltage level.

FIG. 9 includes a circuit diagram 900 of an example of a calibration circuit 902 that may be configured or adapted in accordance with certain aspects of this disclosure. The calibration circuit 902 corresponds in some respects to the Section B circuits 708 of the calibration circuit 700 illustrated in FIG. 7 in FIG. 7 and may be configured to produce the second calibration current 716 using a replica driver stage 910 The replica driver stage 910 may include one or more instances of a replica circuit that replicates the driver stage provided in each driver segment in an output driver. Multiple replica circuits may be coupled in parallel in the replica driver stage 910. The number (N) of replica circuits coupled in parallel may be defined by a controller or processor that initiates, manages or controls calibration procedures, and that may be designated herein as the calibration controller, regardless of whether the designated controller or processor is configured to perform other functions.

The calibration circuit 902 includes an error amplifier 904 that may be configured to maintain a nominal voltage across the replica driver stage 910. The error amplifier 904 receives a reference voltage 920 that may be calibrated or configured to follow or define $V_{LDO}$. In the illustrated example, the output of the error amplifier 904 is coupled to the gate terminals of multiple PMOS transistors 906, 908, including a variable number of trimming PMOS transistors 906 and a variable number of output PMOS transistors 908. The source terminals of the trimming PMOS transistors 906 are coupled to the VDD power rail. The drain terminals of the trimming PMOS transistors 906 are coupled through a feedback node 916 to the replica driver stage 910. The voltage at the feedback node 916 is fed back to the error amplifier 904 such that the voltage at the feedback node 916 follows the reference voltage 920. In the illustrated example, the voltage at the feedback node 916 is equal to $V_{LDO}$.

Each of the trimming PMOS transistors 906, when enabled, is configured to provide a current to the replica driver stage 910. In various examples, a trimming PMOS transistor 906 may be selectively enabled or disabled by coupling a terminal of the trimming PMOS transistor 906 through a transistor switch. The number (L) of enabled trimming PMOS transistors 906 may be defined by the calibration controller. The current 918 flowing through the replica driver stage 910 is the sum of the contributions of the active trimming PMOS transistors 906. In the illustrated example, the replica driver stage 910 receives a current that may be calculated as:

$$I_{rep} = \frac{N \times V_{LDO}}{R_{LSB}},$$

where $R_{LSB}$ represents the output resistance of a single driver segment and corresponds to the resistance provided by each replica circuit coupled in parallel in the replica driver stage 910. Absent other scaling, the ability to select the value of N enables calibration to be performed iteratively using different increments in resistance value. Setting N=1 enables calibration in resistance step sizes of $R_{LSB}$ ohms, while setting N=8 enables calibration in resistance step sizes of $8\times R_{LSB}$ ohms. The current contributed ($I_{contrib}$) by each active trimming PMOS transistor 906 may be calculated as:

$$I_{contrib} = \frac{I_{rep}}{L}.$$

The error amplifier 904 may be configured to adjust the voltage of its output 914 to maintain the voltage at the feedback node 916 equal to the reference voltage 920. An increase or decrease in the voltage of the output 914 results in a corresponding decrease or increase of the current flowing through each of the trimming PMOS transistors 906 and through each output PMOS transistor 908. The current 718 ($I_3$) provided to the current mirror 712 through the drain of a variable number of mirror transistors 912 is the sum of the currents through the active output PMOS transistors 908. In various example, an output PMOS transistor 908 may be selectively enabled or disabled by coupling a terminal of the output PMOS transistor 908 through a transistor switch. The number (S) of active output PMOS transistors 908 may be defined by the calibration controller. Accordingly:

$$I_3 = S \times I_{contrib},$$

or:

$$I_3 = S \times \frac{I_{rep}}{L} = S \times \frac{N \times V_{LDO}}{L \times R_{LSB}}.$$

The number (M) of active mirror transistors 912 in the current mirror 712 may be fixed or may be defined by the calibration controller. In some implementations, the value of M may be selected based on the value of L, N and/or S. The base terminal of each active mirror transistor 912 is coupled to the base terminal of transistor 714 in the current mirror 712. The resulting relationship between $I_2$ and $I_3$ may be stated as:

$$I_2 = \left(\frac{I_3}{M}\right),$$

and further:

$$I_2 = S \times \frac{N \times V_{LDO}}{M \times L \times R_{LSB}}.$$

FIG. 10 illustrates one example of a calibration system 1000 that may be implemented in accordance with certain aspects of this disclosure. The calibration system 1000 may be used to calibrate an output driver. The illustrated calibration system 1000 includes three sections that may cooperate to configure driver segments in the output driver. In the illustrated example, the Section A circuits 1002 and the Section B circuits 1010 may generate and/or configure calibration currents 706, 716 flowing in transistors 704, 714 of the Section C circuits 1020, respectively. The Section C circuits 1020 include a current comparator 720. The calibration currents 706, 716 are provided to inputs of the current comparator 720, which may be configured to provide an output 722 that indicates which of the calibration current 706 or 716 has a greater amplitude. In the illustrated example, the Section A circuits 1002 may correspond in some respects to the calibration circuit 800 illustrated in FIG. 8 with certain details added, the Section B circuits 1010 may correspond in some respects to the calibration circuit 900 illustrated in FIG. 9 with certain details added, and the Section C circuits 1020 may correspond in some respects to the Section C circuits 710 illustrated in FIG. 7 with certain details added.

The first calibration circuit 1002 includes a current source 804 and a first variable resistor 806 ($R_{Vldo}$) that can generate a reference voltage that is nominally equal to $V_{LDO}$. In the illustrated example, a 25 μA current produced by the current source 804 passes through the first variable resistor 806. The first variable resistor 806 is configured by a control code with a resistance value to causes a voltage drop across the first variable resistor 806 that is nominally equal to $V_{LDO}$. A control code 816 may be configured to define the resistance value of the first variable resistor 806. In the illustrated example, the control code 816 encodes a 5-bit value that enables the first calibration circuit 1002 to support a range of $V_{LDO}$ voltages. In some implementations, the current source 804 and the first variable resistor 806 can be independently calibrated.

A first node 814 is coupled to the output of the current source 804, to the first variable resistor 806 and to an input of an error amplifier 810. The voltage at the node 814 is defined by the voltage drop across the first variable resistor 806 and may change in proportion to $V_{LDO}$ as the value encoded by the control code 816 changes. In the illustrated example, the output of the error amplifier 810 is coupled to the gates of the active or enabled PMOS transistors 812. The source terminals of the active or enabled PMOS transistors 812 are coupled to the VDD power rail. The drain terminals of the active or enabled PMOS transistors 812 are coupled through a second node 820 to a second variable resistor 808. The voltage at the second node 820 is fed back to the error amplifier 810 such that the voltage at the second node 820 follows the voltage at the first node 814. In the illustrated example, the voltage at the second node 820 follows the voltage at the first node 814 and is equal to $V_{LDO}$. The current provided to the second variable resistor 808 is the sum of the currents provided by each active or enabled PMOS transistor 812. In various example, an active or enabled PMOS transistor 812 may be selectively enabled or disabled by coupling a terminal of the output PMOS transistor 812 through a transistor switch. A transistor may be considered to be active when it is enabled and inactive when it is disabled. In some instances, the number of active or enabled PMOS transistors 812 may be defined by a calibration controller.

In the illustrated example, the second variable resistor 808 may be used to represent the termination resistance defined for the output driver, and may be referred to herein as the target resistance or termination resistance or $R_{Target}$. A control code may be configured to define the resistance value of the second variable resistor 808. In some implementations, the control code configures or programs the second variable resistor 808 to obtain a resistance value that corresponds to the termination impedance specified for the output driver. In some implementations, the second variable resistor 808 may be tuned to provide a resistance that is different from or not proportionate to the termination resistance defined for the output driver. In some implementations, the second variable resistor 808 provides a fixed resistance or a resistance configured during system integration or initialization. The amplitude of the first calibration current 706 is expected to equal or approximate the amplitude of a nominal output current of the output driver that flows through the specified termination impedance at the specified $V_{LDO}$ voltage level.

The number of active or enabled PMOS transistors 812 may be configured to scale the first calibration current 706. In the illustrated example, the first calibration current 706 is produced by some number (Q) of enabled PMOS transistors 704 that have base terminals coupled to the output of the error amplifier 810, source terminals coupled to VDD and drain terminals coupled to an input of the current comparator 720. The voltage at the output of the error amplifier 810 is configured by feedback to cause each the active or enabled PMOS transistors 812 to produce a portion ($1/P^{th}$) of the current provided to the second variable resistor 808. The voltage at the output of the error amplifier 810 also causes each of the active or enabled PMOS transistors 704 to produce the level of current produced by each of the active or enabled PMOS transistors 812. The total current produced by the enabled PMOS transistors 704 may be stated as:

$$I_1 = \frac{Q}{P} \times \frac{V_{LDO}}{R_{Target}},$$

when the second variable resistor 808 is configured to have a resistance equal to the termination resistance ($R_{Target}$) defined for the output driver. In various examples, a transistor can be enabled or disabled by selectively coupling at least one of its terminals through a switch, which can be implemented using a suitably configured transistor. In some implementations, the number of active output PMOS transistors 704 may be defined by a calibration controller.

The second calibration circuit 1010 may be configured to produce the second calibration current 716 using a replica driver stage 910. The replica driver stage 910 may include one or more instances of a replica circuit segment that replicates the driver stage provided in a driver segment in an output driver. In the illustrated calibration system 1000, multiple replica circuit segments may be coupled in parallel in the replica driver stage 910. The number (N) of replica circuit segments coupled in parallel may be defined by a controller or processor that initiates, manages or controls calibration procedures, and that may be designated herein as the calibration controller, regardless of whether the designated controller or processor is configured to perform other functions.

The second calibration circuit 1010 includes an error amplifier 904 that may be configured to maintain a nominal $V_{LDO}$ voltage across the replica driver stage 910. The error amplifier 904 receives a reference voltage 920 that may be calibrated or configured to follow or define $V_{LDO}$. In the illustrated example, the output of the error amplifier 904 is coupled to the gate terminals of multiple PMOS transistors, including PMOS transistors 906 in a variable number of trimming segments and PMOS transistors 908 in a variable number of output segments. The source terminals of the PMOS transistors 906 in the trimming segments are coupled to the VDD power rail. The drain terminals of the PMOS transistors 906 in the trimming segments are coupled through a feedback node 916 to the replica driver stage 910. The voltage at the feedback node 916 is fed back to the error amplifier 904 such that the voltage at the feedback node 916 follows the reference voltage 920. In the illustrated example, the voltage at the feedback node 916 is nominally equal to $V_{LDO}$.

Each of the PMOS transistors 906 in the trimming segments is configured to provide a current to the replica driver stage 910 when enabled. In various example, a PMOS transistor 906 in a trimming segment may be selectively enabled or disabled by coupling a terminal of the PMOS transistors 906 in the trimming segment through a transistor or other switch. The number (L) of enabled PMOS transistors 906 in the trimming segments may be defined by the calibration controller. The current 918 flowing through the replica driver stage 910 is the sum of the contributions of the active PMOS transistors 906 in the trimming segments. The error amplifier 904 may be configured to adjust the voltage of its output 914 to maintain the voltage at the feedback node 916 equal to the reference voltage 920. An increase or decrease in the voltage of the output 914 results in a corresponding decrease or increase of the current flowing through each of the PMOS transistors 906 in the trimming segments and through each output PMOS transistors 908 in the output segments.

The current produced by each of the PMOS transistors 908 in the enabled output segments is expected to equal the current produced by each of the PMOS transistors in the enabled PMOS transistors 906 in the trimming segments. The current 718 ($I_3$) provided to the current mirror 712 through the drain of a variable number of mirror transistors 912 is the sum of the currents produced by the active PMOS transistors 908 in the output segments. In various examples, a PMOS transistor 908 in an output segment may be selectively enabled or disabled by coupling terminals of PMOS transistors 908 in the output segments through a transistor switch. The number (S) of active PMOS transistors 908 in the output segments may be defined by the calibration controller.

The number (M) of active mirror transistors 912 in the current mirror 712 may be fixed or may be defined by the calibration controller. In some implementations, the value of M may be selected based on the value of L, N and/or S. The base terminal of each active mirror transistor 912 is coupled to the base terminal of transistor 714 in the current mirror 712 provided in the Section C circuits 1020.

In the illustrated example, each of the PMOS transistors 906 in the trimming segments and each of the PMOS transistors 908 in the output segments includes two PMOS transistors coupled in parallel. It can be noted that this doubling of transistors does modify the calculation of $I_2$, since the transistor multipliers cancel each other:

$$I_2 = (2S) \times \frac{N \times V_{LDO}}{M \times (2L) \times R_{LSB}} = S \times \frac{N \times V_{LDO}}{M \times L \times R_{LSB}}.$$

The value of S may be incrementally adjusted during calibration until ($I_2 \approx I_1$), which may be indicated by a transition in signaling state of the current comparator 720 that occurs following a change in the value of S. When $I_1$ is nominally equal to the current flowing through the termination impedance defined for the line driver and $I_2 \approx I_1$, then:

$$I_1 = \frac{V_{LDO}}{R_{Target}} \approx S \times \frac{N \times V_{LDO}}{M \times L \times R_{LSB}},$$

yielding:

$$S \approx \frac{V_{LDO} \times M \times L \times R_{LSB}}{R_{Target} \times N \times V_{LDO}},$$

which may be written:

$$S \approx \frac{L \times M}{N} \times \frac{R_{LSB}}{R_{Target}},$$

The variables L, M and/or N enable the currents and/or subcircuits in the second calibration circuit 1010 to be scaled. In the simplest case of L=M=N=1, it is seen that S is $R_{LSB}/R_{Target}$. For example, when $R_{LSB}$ is 3.6 kΩ, and the target, termination impedance is 100Ω, then S=36. In some implementations, the replica driver stage 910 can include eight instances of a replica circuit that replicates the driver stage provided in each driver segment in the output driver. In these implementations, N=8 and the circuit may be configured such that L×M=8 in order to obtain S=36 when $R_{LSB}$=3.6 kΩ and $R_{Target}$=100Ω.

Scaling can enable the calibration circuits to be simplified. For example, the number of PMOS transistors 908 can be reduced when the calibration controller is configured to apply a scaling factor when determining the number of driver segments that are to be enabled in the output driver. In some implementations, the calibration procedure can commence with an estimated value for S.

Figure 11:
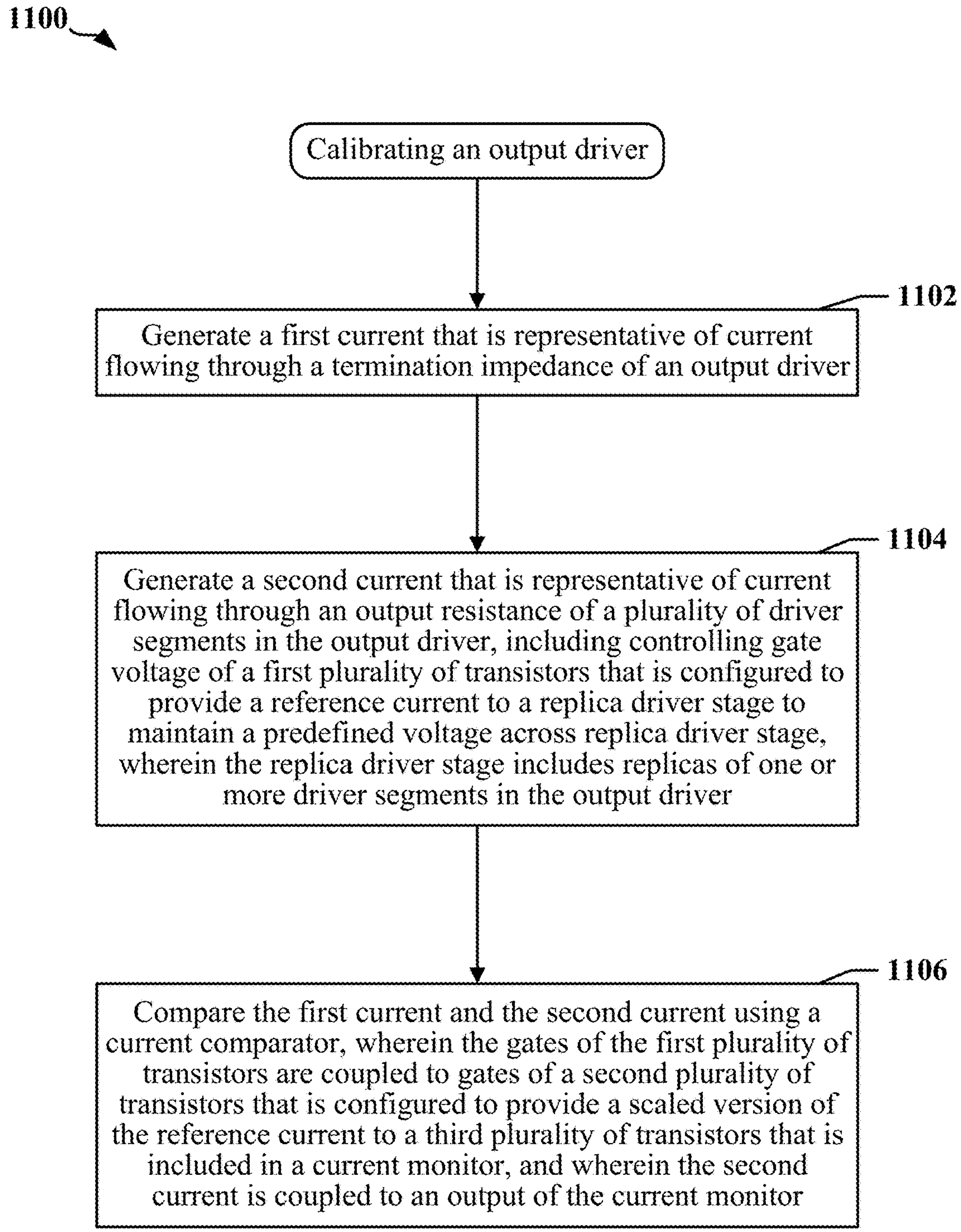
FIG. 11 is a flowchart illustrating an example of a method for calibrating an output driver in accordance with certain aspects of this disclosure.

FIG. 11 is a flowchart 1100 illustrating an example of a method for calibrating an output driver in accordance with certain aspects of this disclosure. The method may be implemented using a controller in a physical layer interface that is coupled to a data communication link. For example, a controller or processor may initiate, manage or control calibration procedures, and may be referred to herein as the calibration controller. The calibration controller may be configured to perform other related or unrelated functions. In certain examples, the calibration controller may be implemented using one or more of the processors 102, 104, 106, 108 illustrated in FIG. 1. In some examples, the calibration controller may be implemented using a controller in the physical interface circuits of a data communication link. In some examples, the calibration controller may be implemented using a core processor in an IC device. In some examples, the calibration controller may be implemented using a dedicated controller or processor. The calibration controller may further configure and/or control the Section A circuits 702, Section B circuits 708 and/or Section C circuits 710 illustrated in FIG. 7, the calibration circuit 800 illustrated in FIG. 8, the calibration circuit 900 illustrated in FIG. 9 or the Section A circuits 1002, the Section B circuits 1010 and/or the Section C circuits 1020 illustrated in FIG. 10.

At block 1102, a first current may be generated. The first current may be representative of current flowing through a termination impedance of an output driver.

At block 1104, a second current may be generated. The second current may be representative of current flowing through a replica driver stage. The replica driver stage may include one or more replicas of a driver stage in a driver segment in the output driver. Generating the second current may include controlling gate voltage of a first plurality of transistors. The first plurality of transistors may be configured to provide a reference current to the replica driver and thereby maintain a predefined voltage across the replica driver.

At block 1106, the first current and the second current may be compared using a current comparator. A change in state of the output of the current comparator may indicate when the calibration is completed. The gates of the first plurality of transistors are coupled to gates of a second plurality of transistors. The second plurality of transistors may be configured to provide a scaled version of the reference current to a third plurality of transistors that is included in a current mirror. The second current is received from the current comparator.

In some implementations, the first plurality of transistors and the second plurality of transistors receive power from a first power rail. The predefined voltage level may correspond to the voltage level at which a second power rail delivers power. In some examples, the first power rail and second power rail deliver power at different voltages.

In some implementations, the method includes scaling the second current such that amplitude of the second current is a multiple of the amplitude of current flowing in the replica driver stage.

In some implementations, the first plurality of transistors includes a first number (L) of transistors the second plurality of transistors includes a second number (S) of transistors, the third plurality of transistors includes a third number (M) of transistors and the replica driver stage includes a number (N) replicas of the driver segment. A nominal terminal resistance ($R_{Target}$) may be defined for the output driver and each driver segment in the output driver may have an output resistance ($R_{LSB}$). In these implementations:

$$S \approx \frac{L \times M}{N} \times \frac{R_{LSB}}{R_{Target}},$$

when an amplitude of the current provided to the first input of the current comparator equals an amplitude of the current provided to the second input of the current comparator.

In some implementations, iteratively the number of active transistors in the second plurality of transistors may be iteratively increased or decreased until signaling state of an output of the current comparator changes The operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a transistor, a circuit, an operational amplifier configured as a comparator or error amplifier, an application-specific integrated circuit (ASIC), or processor. Generally, where there are operations illustrated in figures, those operations may have corresponding counterpart means-plus-function components with similar numbering.

In one example aspects, an apparatus includes means for generating a first current that is representative of current flowing through a termination impedance of an output driver, means for generating a second current that is representative of current flowing through a replica driver comprising one or more replicas of a driver segment in the output driver and a current comparator. The current comparator may be configured to compare the first current and the second current. The means for generating the second current may include a first plurality of transistors powered by a first power rail, a second plurality of transistors powered by the first power rail, a third plurality of transistors, a replica driver stage, and an error amplifier. The replica driver stage may be coupled between the first power rail and ground through the first plurality of transistors. The replica driver stage may include replicas of one or more driver segments in the output driver. The error amplifier may have a first input coupled to a reference voltage source, a second input coupled to a node through which the output of the first plurality of transistors is coupled to the replica driver stage, and an output coupled to a gate of each transistor in the first plurality of transistors and the second plurality of transistors. The third plurality of transistors may be included in a current mirror and configured to receive a current from the second plurality of transistors. At least one mirror transistor may be configured to provide an output of the current mirror to a second input of the current comparator.

In some implementations, the reference voltage source is configured to maintain the first input of the error amplifier at a voltage that is equal to voltage of a second power rail.

In some implementations, the apparatus includes means for scaling the second current such that amplitude of current flowing through the at least one mirror transistor is a multiple of the amplitude of current flowing in the replica driver stage. For example, the first plurality of transistors may include a first number (L) of transistors, the second plurality of transistors may include a second number (S) of transistors, the third plurality of transistors may include a third number (M) of transistors and the replica driver stage may include a number (N) replicas of the driver segment. Scaling may be accomplished by selectively changing L, M, N and/or S. In this example, where a nominal terminal resistance ($R_{Target}$) is defined for the output driver, each driver segment in the output driver has an output resistance ($R_{LSB}$) and wherein:

$$S \approx \frac{L \times M}{N} \times \frac{R_{LSB}}{R_{Target}},$$

when an amplitude of the current provided to the first input of the current comparator equals an amplitude of the current provided to the second input of the current comparator.

A calibration circuit comprising three sections may be provided in an output driver. A first section may include a first plurality of transistors powered by a first power rail, a first error amplifier and a variable resistor. The first error amplifier may have a first input coupled to a first reference voltage source, a second input coupled to a feedback signal provided by an output of the first plurality of transistors and an output coupled to a gate of each transistor in the first plurality of transistors. The variable resistor may be coupled to the output of each transistor in the first plurality of transistors.

A second section may include a second plurality of transistors powered by the first power rail, a third plurality of transistors powered by the first power rail, a fourth plurality of transistors, a replica driver stage and a second error amplifier. The second plurality of transistors and third plurality of transistors may be powered by the first power rail. The replica driver stage may be coupled between the first power rail and ground through the second plurality of transistors. The replica driver stage may include replicas of one or more driver segments in the output driver. The second error amplifier may have a first input coupled to a second reference voltage source, a second input coupled to a node through which the output of the second plurality of transistors is coupled to the replica driver stage, and an output coupled to a gate of each transistor in the second plurality of transistors and the third plurality of transistors. The fourth plurality of transistors may be included in a current mirror. The fourth plurality of transistors may be configured to receive a current from the third plurality of transistors.

A third section may include a current comparator, a fifth plurality of transistors and at least one mirror transistor. The fifth plurality of transistors may be powered by the first power rail. Each transistor in the fifth plurality of transistors may have a gate that is coupled to the output of the first error amplifier, which is provided in the first section. An output of the fifth plurality of transistors may be coupled to a first input of the current comparator. The mirror transistor may be configured to provide an output of the current mirror to a second input of the current comparator.

In certain implementations, the first reference voltage source in the first section includes a current source that is coupled between the first power rail and ground through a programmable resistor. The first input of the first error amplifier may be coupled to a node through which the current source is coupled to the programmable resistor. The programmable resistor may be configured to provide a voltage at the node that is equal to voltage of a second power rail. The first power rail and the second power rail may deliver power at different voltages. The variable resistor coupled to the output of each transistor in the first plurality of transistors may be configured to provide a resistance that represents or matches a nominal terminal impedance specified for the output driver.

In certain implementations, the amplitude of current provided to the first input of the current comparator is a multiple (P/Q) of the amplitude of current flowing in the variable resistor. The multiple of the amplitude may be defined by a ratio of number (P) of transistors in the first plurality of transistors to number (Q) of transistors in the fifth plurality of transistors. The amplitude of the current provided to the second input of the current comparator may be a multiple of the amplitude of current flowing in the replica driver stage.

In certain implementations, the second reference voltage source is configured to maintain the first input of the second error amplifier in the second stage at a voltage that is equal to voltage of a second power rail. The second plurality of transistors may include a first number (L) of transistors, the third plurality of transistors may include a second number (S) of transistors, the fourth plurality of transistors may include a third number (M) of transistors and the replica driver stage may include a number (N) replicas of the driver segment. The variable resistor in the first section may be configured to provide a first resistance ($R_{Target}$), each driver segment in the output driver may have a second resistance ($R_{LSB}$) and wherein:

$$S \approx \frac{L \times M}{N} \times \frac{R_{LSB}}{R_{Target}},$$

when an amplitude of the current provided to the first input of the current comparator equals an amplitude of the current provided to the second input of the current comparator.

Some implementation examples are described in the following numbered clauses:

1. A calibration circuit in an output driver comprising: a first section that includes: a first plurality of transistors powered by a first power rail; a first error amplifier having a first input coupled to a first reference voltage source, a second input coupled to a feedback signal provided by an output of the first plurality of transistors and an output coupled to a gate of each transistor in the first plurality of transistors; and a variable resistor coupled to the output of each transistor in the first plurality of transistors; a second section that includes: a second plurality of transistors powered by the first power rail; a third plurality of transistors powered by the first power rail; a replica driver stage coupled between the first power rail and ground through the second plurality of transistors, the replica driver stage comprising one or more replicas of a driver segment in the output driver; a second error amplifier having a first input coupled to a second reference voltage source, a second input coupled to a node through which the output of the second plurality of transistors is coupled to the replica driver stage, and an output coupled to a gate of each transistor in the second plurality of transistors and a gate of each transistor in the third plurality of transistors; and a fourth plurality of transistors that is included in a current mirror and configured to receive a current from the third plurality of transistors; and a third section that includes: a current comparator; and a fifth plurality of transistors powered by the first power rail, each transistor in the fifth plurality of transistors having a gate that is coupled to the output of the first error amplifier, wherein an output of the fifth plurality of transistors is coupled to a first input of the current comparator; and at least one mirror transistor configured to provide an output of the current mirror to a second input of the current comparator.
2. The calibration circuit as described in clause 1, wherein the first reference voltage source comprises: a current source coupled between the first power rail and ground through a programmable resistor, wherein the first input of the first error amplifier is coupled to a node through which the current source is coupled to the programmable resistor.
3. The calibration circuit as described in clause 2, wherein the programmable resistor is configured to provide a voltage at the node that is equal to voltage of a second power rail, and wherein the first power rail and second power rail deliver power at different voltages.
4. The calibration circuit as described in any of clauses 1-3, wherein the variable resistor is configured to provide a resistance that represents or matches a nominal terminal impedance specified for the output driver.
5. The calibration circuit as described in any of clauses 1-4, wherein amplitude of current provided to the first input of the current comparator is a multiple (P/Q) of the amplitude of current flowing in the variable resistor.
6. The calibration circuit as described in clause 5, wherein the multiple of the amplitude is defined by a ratio of number (P) of transistors in the first plurality of transistors to number (Q) of transistors in the fifth plurality of transistors.
7. The calibration circuit as described in any of clauses 1-6, wherein the second reference voltage source is configured to maintain the first input of the second error amplifier at a voltage that is equal to voltage of a second power rail.
8. The calibration circuit as described in any of clauses 1-7, wherein amplitude of current provided to the second input of the current comparator is a multiple of the amplitude of current flowing in the replica driver stage.
9. The calibration circuit as described in any of clauses 1-8, wherein the second plurality of transistors includes a first number (L) of transistors, the third plurality of transistors includes a second number (S) of transistors, the fourth plurality of transistors includes a third number (M) of transistors and the replica driver stage includes a number (N) replicas of the driver segment.
10. The calibration circuit as described in clause 9, wherein the variable resistor is configured to provide a first resistance ($R_{Target}$), the driver segment in the output driver has a second resistance ($R_{LSB}$) and wherein:

$$S \approx \frac{L \times M}{N} \times \frac{R_{LSB}}{R_{Target}},$$

when an amplitude of the current provided to the first input of the current comparator equals an amplitude of the current provided to the second input of the current comparator.

11. An apparatus comprising: means for generating a first current that is representative of current flowing through a termination impedance of an output driver; means for generating a second current that is representative of current flowing through a replica driver comprising one or more replicas of a driver segment in the output driver; and a current comparator configured to compare the first current and the second current, wherein the means for generating the second current comprises: a first plurality of transistors powered by a first power rail; a second plurality of transistors powered by the first power rail; a replica driver stage coupled between the first power rail and ground through the first plurality of transistors, the replica driver stage comprising one or more replicas of a driver segment in the output driver; an error amplifier having a first input coupled to a reference voltage source, a second input coupled to a node through which the output of the first plurality of transistors is coupled to the replica driver stage, and an output coupled to a gate of each transistor in the first plurality of transistors and a gate of each transistor in the second plurality of transistors; a third plurality of transistors that is included in a current mirror and configured to receive a current from the second plurality of transistors; and at least one mirror transistor configured to provide an output of the current mirror to a second input of the current comparator.

12. The apparatus as described in clause 11, wherein the reference voltage source is configured to maintain the first input of the error amplifier at a voltage that is equal to voltage of a second power rail.

13. The apparatus as described in clause 11 or clause 12, further comprising: means for scaling the second current such that amplitude of current flowing through the at least one mirror transistor is a multiple of the amplitude of current flowing in the replica driver stage.

14. The apparatus as described in any of clauses 11-13, wherein the first plurality of transistors includes a first number (L) of transistors, the second plurality of transistors includes a second number (S) of transistors, the third plurality of transistors includes a third number (M) of transistors and the replica driver stage includes a number (N) replicas of the driver segment, wherein a nominal terminal resistance ($R_{Target}$) is defined for the output driver, wherein each driver segment in the output driver has an output resistance ($R_{LSB}$) and wherein:

$$S \approx \frac{L \times M}{N} \times \frac{R_{LSB}}{R_{Target}},$$

when an amplitude of the current provided to the first input of the current comparator equals an amplitude of the current provided to the second input of the current comparator.

15. A method for calibrating an output driver, comprising: generating a first current that is representative of current flowing through a termination impedance of an output driver; generating a second current that is representative of current flowing through a replica driver stage comprising one or more replicas of a driver stage in a driver segment in the output driver; and comparing the first current and the second current using a current comparator, wherein generating the second current comprises: controlling gate voltage of a first plurality of transistors configured to provide a reference current to the replica driver stage to maintain a predefined voltage across the replica driver stage, wherein the gates of the first plurality of transistors are coupled to gates of a second plurality of transistors that is configured to provide a scaled version of the reference current to a third plurality of transistors that is included in a current mirror, and wherein the second current is received from the current comparator.

16. The method as described in clause 15, wherein the first plurality of transistors and the second plurality of transistors receive power from a first power rail, wherein the predefined voltage level corresponds to voltage level at which a second power rail delivers power.

17. The method as described in clause 16, wherein the first power rail and second power rail deliver power at different voltages.

18. The method as described in any of clauses 15-17, further comprising: scaling the second current such that amplitude of the second current is a multiple of the amplitude of current flowing in the replica driver stage.

19. The method as described in any of clauses 15-18, wherein the first plurality of transistors includes a first number (L) of active transistors, the second plurality of transistors includes a second number (S) of active transistors, the third plurality of transistors includes a third number (M) of active transistors and the replica driver stage includes a number (N) replicas of the driver segment, wherein a nominal terminal resistance ($R_{Target}$) is defined for the output driver, wherein each driver segment in the output driver has an output resistance ($R_{LSB}$) and wherein:

$$S \approx \frac{L \times M}{N} \times \frac{R_{LSB}}{R_{Target}},$$

when an amplitude of the current provided to the first input of the current comparator equals an amplitude of the current provided to the second input of the current comparator.

20. The method as described in clause 19, further comprising: iteratively increasing or decreasing the number of active transistors in the second plurality of transistors until signaling state of an output of the current comparator changes.

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A calibration circuit in an output driver comprising:

a first section that includes:

a first plurality of transistors powered by a first power rail;

a first error amplifier having a first input coupled to a first reference voltage source, a second input coupled to a feedback signal provided by an output of the first plurality of transistors and an output coupled to a gate of each transistor in the first plurality of transistors; and a variable resistor coupled to the output of each transistor in the first plurality of transistors;

a second section that includes:

a second plurality of transistors powered by the first power rail;

a third plurality of transistors powered by the first power rail;

a replica driver stage coupled between the first power rail and ground through the second plurality of transistors, the replica driver stage comprising one or more replicas of a driver segment in the output driver;

a second error amplifier having a first input coupled to a second reference voltage source, a second input coupled to a node through which the output of the second plurality of transistors is coupled to the replica driver stage, and an output coupled to a gate of each transistor in the second plurality of transistors and a gate of each transistor in the third plurality of transistors; and a fourth plurality of transistors that is included in a current mirror and configured to receive a current from the third plurality of transistors; and a third section that includes:

a current comparator; and a fifth plurality of transistors powered by the first power rail, each transistor in the fifth plurality of transistors having a gate that is coupled to the output of the first error amplifier, wherein an output of the fifth plurality of transistors is coupled to a first input of the current comparator; and at least one mirror transistor configured to provide an output of the current mirror to a second input of the current comparator.

2. The calibration circuit of claim 1, wherein the first reference voltage source comprises:

a current source coupled between the first power rail and ground through a programmable resistor, wherein the first input of the first error amplifier is coupled to a node through which the current source is coupled to the programmable resistor.

3. The calibration circuit of claim 2, wherein the programmable resistor is configured to provide a voltage at the node that is equal to voltage of a second power rail, and wherein the first power rail and second power rail deliver power at different voltages.

4. The calibration circuit of claim 1, wherein the variable resistor is configured to provide a resistance that represents or matches a nominal terminal impedance specified for the output driver.

5. The calibration circuit of claim 1, wherein amplitude of current provided to the first input of the current comparator is a multiple (P/Q) of the amplitude of current flowing in the variable resistor.

6. The calibration circuit of claim 5, wherein the multiple of the amplitude is defined by a ratio of number (P) of transistors in the first plurality of transistors to number (Q) of transistors in the fifth plurality of transistors.

7. The calibration circuit of claim 1, wherein the second reference voltage source is configured to maintain the first input of the second error amplifier at a voltage that is equal to voltage of a second power rail.

8. The calibration circuit of claim 1, wherein amplitude of current provided to the second input of the current comparator is a multiple of the amplitude of current flowing in the replica driver stage.

9. The calibration circuit of claim 1, wherein the second plurality of transistors includes a first number (L) of transistors, the third plurality of transistors includes a second number (S) of transistors, the fourth plurality of transistors includes a third number (M) of transistors and the replica driver stage includes a number (N) replicas of the driver segment.

10. The calibration circuit of claim 9, wherein the variable resistor is configured to provide a first resistance ($R_{Target}$), the driver segment in the output driver has a second resistance ($R_{LSB}$) and wherein:

$$S \approx \frac{L \times M}{N} \times \frac{R_{LSB}}{R_{Target}},$$

when an amplitude of the current provided to the first input of the current comparator equals an amplitude of the current provided to the second input of the current comparator.

11. An apparatus comprising:

means for generating a first current that is representative of current flowing through a termination impedance of an output driver;

means for generating a second current that is representative of current flowing through a replica driver comprising one or more replicas of a driver segment in the output driver; and a current comparator configured to compare the first current and the second current, wherein the means for generating the second current comprises:

a first plurality of transistors powered by a first power rail;

a second plurality of transistors powered by the first power rail;

a replica driver stage coupled between the first power rail and ground through the first plurality of transistors, the replica driver stage comprising one or more replicas of a driver segment in the output driver;

an error amplifier having a first input coupled to a reference voltage source, a second input coupled to a node through which the output of the first plurality of transistors is coupled to the replica driver stage, and an output coupled to a gate of each transistor in the first plurality of transistors and a gate of each transistor in the second plurality of transistors;

a third plurality of transistors that is included in a current mirror and configured to receive a current from the second plurality of transistors; and at least one mirror transistor configured to provide an output of the current mirror to a second input of the current comparator.

12. The apparatus of claim 11, wherein the reference voltage source is configured to maintain the first input of the error amplifier at a voltage that is equal to voltage of a second power rail.

13. The apparatus of claim 11, further comprising:

means for scaling the second current such that amplitude of current flowing through the at least one mirror transistor is a multiple of the amplitude of current flowing in the replica driver stage.

14. The apparatus of claim 11, wherein the first plurality of transistors includes a first number (L) of transistors, the second plurality of transistors includes a second number (S) of transistors, the third plurality of transistors includes a third number (M) of transistors and the replica driver stage includes a number (N) replicas of the driver segment, wherein a nominal terminal resistance ($R_{Target}$) is defined for the output driver, wherein each driver segment in the output driver has an output resistance ($R_{LSB}$) and wherein:

$$S \approx \frac{L \times M}{N} \times \frac{R_{LSB}}{R_{Target}},$$

when the amplitude of the current provided to the first input of the current comparator equals the amplitude of the current provided to the second input of the current comparator.

15. A method for calibrating an output driver, comprising:

generating a first current that is representative of current flowing through a termination impedance of an output driver;

generating a second current that is representative of current flowing through a replica driver stage comprising one or more replicas of a driver stage in a driver segment in the output driver; and comparing the first current and the second current using a current comparator, wherein generating the second current comprises:

controlling gate voltage of a first plurality of transistors configured to provide a reference current to the replica driver stage to maintain a predefined voltage across the replica driver stage, wherein the gates of the first plurality of transistors are coupled to gates of a second plurality of transistors that is configured to provide a scaled version of the reference current to a third plurality of transistors that is included in a current mirror, and wherein the second current is received from the current comparator.

16. The method of claim 15, wherein the first plurality of transistors and the second plurality of transistors receive power from a first power rail, wherein the predefined voltage corresponds to voltage at which a second power rail delivers power.

17. The method of claim 16, wherein the first power rail and second power rail deliver power at different voltages.

18. The method of claim 15, further comprising:

scaling the second current such that amplitude of the second current is a multiple of the amplitude of current flowing in the replica driver stage.

19. The method of claim 15, wherein the first plurality of transistors includes a first number (L) of active transistors, the second plurality of transistors includes a second number (S) of active transistors, the third plurality of transistors includes a third number (M) of active transistors and the replica driver stage includes a number (N) replicas of the driver segment, wherein a nominal terminal resistance ($R_{Target}$) is defined for the output driver, wherein each driver segment in the output driver has an output resistance ($R_{LSB}$) and wherein:

$$S \approx \frac{L \times M}{N} \times \frac{R_{LSB}}{R_{Target}},$$

when the amplitude of the current provided to the first input of the current comparator equals the amplitude of the current provided to the second input of the current comparator.

20. The method of claim 19, further comprising:

iteratively increasing or decreasing the number of active transistors in the second plurality of transistors until signaling state of an output of the current comparator changes.

* * * * *